United States Patent
Shim et al.

(10) Patent No.: US 9,576,666 B2
(45) Date of Patent: Feb. 21, 2017

(54) NON-VOLATILE MEMORY DEVICE, OPERATING METHOD THEREOF, MEMORY SYSTEM INCLUDING THE NON-VOLATILE MEMORY DEVICE, AND OPERATING METHOD OF THE MEMORY SYSTEM

(71) Applicants: Young-Seop Shim, Seoul (KR); Jae-Hong Kim, Seoul (KR)

(72) Inventors: Young-Seop Shim, Seoul (KR); Jae-Hong Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/055,747

(22) Filed: Feb. 29, 2016

(65) Prior Publication Data

US 2016/0372199 A1 Dec. 22, 2016

(30) Foreign Application Priority Data

Jun. 22, 2015 (KR) ........................ 10-2015-0088723

(51) Int. Cl.
*G11C 16/04* (2006.01)
*G11C 16/26* (2006.01)
*G11C 16/34* (2006.01)

(52) U.S. Cl.
CPC ........... *G11C 16/0483* (2013.01); *G11C 16/26* (2013.01); *G11C 16/34* (2013.01); *G11C 16/349* (2013.01)

(58) Field of Classification Search
CPC .............................. G11C 16/34; G11C 16/349
USPC ......................................... 365/185.09, 185.17
See application file for complete search history.

(56) References Cited

U.S. PATENT DOCUMENTS

| | | | |
|---|---|---|---|
| 7,602,648 B2 | 10/2009 | Lee | |
| 8,365,030 B1* | 1/2013 | Choi | G06F 11/1048 714/746 |
| 8,514,624 B2 | 8/2013 | Parat et al. | |
| 8,891,300 B2 | 11/2014 | Oh et al. | |
| 8,891,307 B2 | 11/2014 | Nam | |
| 8,971,119 B2 | 3/2015 | Avila et al. | |
| 9,036,419 B2 | 5/2015 | Park et al. | |
| 2006/0104116 A1 | 5/2006 | Yoon et al. | |
| 2013/0070525 A1* | 3/2013 | Shimura | G11C 11/5628 365/185.03 |
| 2013/0088921 A1 | 4/2013 | Nam et al. | |
| 2014/0169095 A1 | 6/2014 | Avila et al. | |
| 2015/0178000 A1* | 6/2015 | Yoon | G06F 3/0619 711/103 |

(Continued)

FOREIGN PATENT DOCUMENTS

KR 1020080053985 6/2008
KR 1020080061937 A 7/2008

(Continued)

*Primary Examiner* — Son Mai
(74) *Attorney, Agent, or Firm* — Volentine & Whitt, PLLC

(57) ABSTRACT

An operating method of a non-volatile memory device having a string including a plurality of memory cells and a plurality of auxiliary cells, the plurality of memory cells and the plurality of auxiliary cells being connected in series, includes detecting a threshold voltage of at least one of the plurality of auxiliary cells and generating an output signal corresponding to a deterioration level of the plurality of memory cells, based on the threshold voltage.

20 Claims, 26 Drawing Sheets

(56) References Cited

U.S. PATENT DOCUMENTS

2016/0148695 A1* 5/2016 Kim ..................... G11C 16/12
                                                    365/185.03

FOREIGN PATENT DOCUMENTS

KR     1020130087230 A    8/2013
KR       101415744 A    7/2014

* cited by examiner

| ERASE TIMES | REF_SST | REF_DC1 |
|---|---|---|
| 50 | 10 | 10 |
| 100 | 30 | 20 |
| 150 | 50 | 30 |
| 200 | 60 | 40 |
| 250 | 70 | 50 |
| ... | ... | ... |

| MEMORY BLOCK | Charge Loss | HCI |
|---|---|---|
| BLK1 | Good | Medium |
| BLK2 | Good | Good |
| BLK3 | Bad | Medium |
| . . . | . . . | . . . |
| BLKi | Bad | Bad |

NON-VOLATILE MEMORY DEVICE, OPERATING METHOD THEREOF, MEMORY SYSTEM INCLUDING THE NON-VOLATILE MEMORY DEVICE, AND OPERATING METHOD OF THE MEMORY SYSTEM

CROSS-REFERENCE TO RELATED APPLICATION

This application claims the benefit of Korean Patent Application No. 10-2015-0088723, filed on Jun. 22, 2015, in the Korean Intellectual Property Office, the disclosure of which is incorporated herein in its entirety by reference.

BACKGROUND

The disclosure relates to a memory device, and more particularly, to a non-volatile memory device, a memory system including the non-volatile memory device, an operating method of the non-volatile memory device, and an operating method of the memory system.

Memory devices are used to store data and may be divided into volatile memory devices and non-volatile memory devices. A flash memory device, which is an example of a non-volatile memory device, may be used in cellular phones, digital cameras, portable digital assistants (PDAs), mobile computer devices, fixed type computer devices, and other devices.

SUMMARY

The disclosure describes a non-volatile memory device with improved durability, a memory system including the non-volatile memory device, an operating method of the non-volatile memory device, and an operating method of the memory system.

According to an aspect of the disclosure, there is provided an operating method of a non-volatile memory device having a string including a plurality of memory cells and a plurality of auxiliary cells, the plurality of memory cells and the plurality of auxiliary cells being connected in series. The operating method includes detecting a threshold voltage of at least one of the plurality of auxiliary cells and generating an output signal corresponding to a deterioration level of the plurality of memory cells, based on the threshold voltage.

According to another aspect of the disclosure, there is provided an operating method of a memory system including a non-volatile memory device and a memory controller configured to control the non-volatile memory device. The non-volatile memory device includes a string having a plurality of memory cells and a plurality of auxiliary cells, the plurality of memory cells and the plurality of auxiliary cells being connected in series. The operating method includes generating, via the non-volatile memory device, an output signal corresponding to a deterioration level of the plurality of memory cells, based on a threshold voltage of at least one of the plurality of auxiliary cells; transmitting via the non-volatile memory device the output signal to the memory controller; determining via the memory controller the deterioration level of the plurality of memory cells based on the output signal; and controlling via the memory controller the non-volatile memory device based on the determined deterioration level.

According to another aspect of the disclosure, there is provided an operating method of a memory system including a non-volatile memory device and a memory controller configured to control the non-volatile memory device. The non-volatile memory device includes a plurality of strings, each of the strings including a plurality of memory cells connected in series and a string selection transistor connected to a bit line. The operating method includes transmitting, via the memory controller, a command or a control signal to the non-volatile memory device. The non-volatile memory device transmits an output signal corresponding to the number of strings, whose string selection transistors have a threshold voltage that is lower than a predetermined reference value, to the memory controller in response to the command or the signal. The memory controller determines a deterioration level of a memory block including the plurality of strings, based on the output signal, and selects whether to erase the memory block based on the deterioration level of the memory block.

According to another aspect of the disclosure, there is provided an operating method of a memory system including a non-volatile memory device and a memory controller configured to control the non-volatile memory device. The non-volatile memory device includes a plurality of strings, each of the strings including a plurality of memory cells connected in series, a ground selection transistor connected to a source line, and a dummy cell between the plurality of memory cells and the ground selection transistor. The operating method includes transmitting, via the memory controller, a command or a control signal to the non-volatile memory device. The non-volatile memory device transmits an output signal, corresponding to the number of strings whose dummy cells have a threshold voltage that is higher than a predetermined reference value, to the memory controller in response to the command or the control signal. The memory controller determines a deterioration level of a memory block including the plurality of strings, based on the output signal and selects whether to erase the memory block based on the deterioration level of the memory block.

According to another aspect of the disclosure, there is provided a non-volatile memory device having a cell array including a plurality of strings, each of the strings including a plurality of memory cells and a plurality of auxiliary cells connected in series. A voltage generator generates a pass voltage and a read voltage which is less than the pass voltage. A row driver applies the pass voltage or the read voltage to each of word lines connected to the plurality of memory cells and each of gate lines connected to the plurality of auxiliary cells. Control logic controls the row driver to receive a command or a control signal and to apply the pass voltage to the word lines and the read voltage to a first gate line of the gate lines, in response to the command or the control signal. A page buffer, connected to the plurality of strings via bit lines, counts a number of on-cells or a number of off-cells from among the plurality of auxiliary cells connected to the first gate line.

According to another aspect of the disclosure, there is provided an operating method executed by a non-volatile memory device having a plurality of strings. Each string has a plurality of memory cells, which are addressable by an external host, and a plurality of auxiliary cells, which are not addressable by the external host, that are electrically connected in series directly between one of a plurality of bit lines and a common source line. Each string has each of its memory cells addressed by a different word line and each of its auxiliary cells addressed by a different gate line. The plurality of strings constitute a memory block whose memory cells are erased concurrently by an erase operation. Each word line addresses a page of memory cells, which includes a memory cell from each of the strings, that are concurrently programmed by a program operation. Each gate line addresses a group of auxiliary cells, which includes an auxiliary cell from each of the strings. The operating method includes selecting the group of auxiliary cells addressed by a particular one of the gate lines; detecting either the number of auxiliary cells, addressed by the particular gate line, having threshold voltages exceeding a predetermined reference value or the number of auxiliary cells, addressed by the particular gate line, having threshold voltages not exceeding the predetermined reference value; and determining whether to perform the erase operation or the program operation on memory cells of the memory block based upon the detected number of auxiliary cells.

BRIEF DESCRIPTION OF THE DRAWINGS

Exemplary embodiments of the disclosure will be more clearly understood from the following detailed description taken in conjunction with the accompanying drawings in which.

DETAILED DESCRIPTION OF THE EMBODIMENTS

Figure 1:
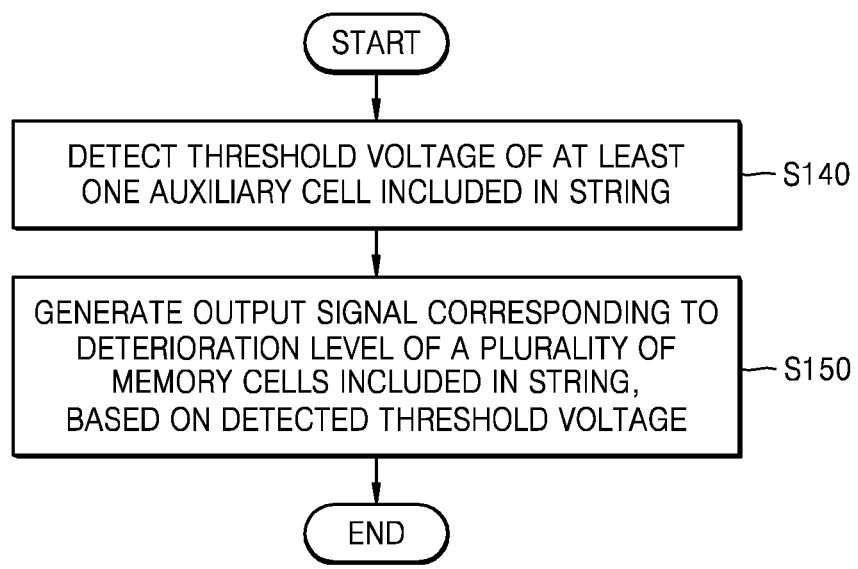
FIG. 1 is a flowchart of an operating method of a non-volatile memory device, according to an exemplary embodiment.

Hereinafter, the disclosure will now be described more fully with reference to the accompanying drawings, in which exemplary embodiments of the disclosure are shown. Like reference numerals in the drawings denote like elements, and a repeated explanation will not be given of overlapping features. Expressions such as "at least one of," when preceding a list of elements, modify the entire list of elements and do not modify the individual elements of the list. As used herein, the term "and/or" includes any and all combinations of one or more of the associated listed items. The disclosed subject matter may, however, be embodied in different forms and should not be construed as limited to the embodiments set forth herein. Rather, these embodiments are provided so that this disclosure is thorough and complete and fully conveys the disclosure to those skilled in the art. It should be understood that exemplary embodiments of the disclosure are to cover all modifications, equivalents, and alternatives falling within the spirit and scope of the disclosure. In the attached drawings, sizes of structures may be exaggerated for clarity.

The terminology used herein is for describing particular embodiments and is not intended to be limiting of exemplary embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of exemplary embodiments.

Unless otherwise defined, all terms (including technical and scientific terms) used herein have the same meanings as commonly understood in the art to which the exemplary embodiments belong. It will be further understood that the terms, such as those defined in commonly used dictionaries, should be interpreted as having meanings consistent with their meanings in the context of the relevant art and will not be interpreted in an idealized or overly formal sense unless expressly so defined herein.

FIG. 1 is a flowchart of an operating method of a non-volatile memory device according to an exemplary embodiment. According to an exemplary embodiment, the operating method of the non-volatile memory device of FIG. 1 may be performed in response to a first command or a first control signal that the non-volatile memory device receives from the outside or may be performed when a specific condition stored in the non-volatile memory device is met.

The non-volatile memory device may include a string including a plurality of memory cells (or main cells) and a plurality of auxiliary cells, wherein the plurality of memory cells and the plurality of auxiliary cells may be connected in series. The plurality of memory cells may have a state corresponding to data stored in the memory cells, for example, a threshold voltage, and the plurality of auxiliary cells may support an operation of writing data to the plurality of memory cells, reading data stored in the plurality of memory cells, or erasing the plurality of memory cells.

When the operation of programming or erasing the memory cells is repeated or when the memory cells are maintained in a specific state for a long time, the memory cells may experience gradual deterioration. Deterioration of the memory cells may denote that the memory cells or physical characteristics of a peripheral structure of the memory cells are changed into undesirable states. Due to the deterioration of the memory cells, data stored in the memory cells may be lost or a data write or read operation with respect to the memory cells may not be normally performed. A memory controller configured to control the non-volatile memory device may prevent the reduction of the lifetime of the non-volatile memory device, caused by the deterioration of the memory cells, by using a control method which considers the deterioration of the memory cells, such as wear leveling. The method of operating the non-volatile memory device according to the present exemplary embodiment may make it possible to easily determine an exact deterioration level of the memory cells, thereby contributing to improving the durability of the non-volatile memory device and preventing the reduction of the lifetime of the non-volatile memory device.

Referring to FIG. 1, in operation S140, a threshold voltage of at least one auxiliary cell included in the string may be detected. The plurality of auxiliary cells included in the string may have the same or substantially the same structure as the plurality of memory cells, and according to repeated operations of programming or erasing the plurality of memory cells, threshold voltages of the plurality of auxiliary cells may also be changed. Thus, the threshold voltage of each of the plurality of auxiliary cells may be used to determine the deterioration level of the plurality of memory cells.

In operation S150, an output signal corresponding to the deterioration level of the plurality of memory cells included in the string may be generated, based on the detected threshold voltage. For example, the number of strings including the auxiliary cell having a threshold voltage that is higher than a predetermined reference value may be counted, and the output signal indicating the number of strings may be generated. The output signal may be output to the outside of the non-volatile memory device, or data corresponding to the output signal may be stored in an additional storage unit included in the non-volatile memory device.

The generated output signal or the data corresponding to the output signal may be used as a basis for determining the deterioration level of the plurality of memory cells. The exact deterioration level of the plurality of memory cells may be determined by determining states of the plurality of auxiliary cells geographically adjacent to the plurality of memory cells. Also, the deterioration level of the plurality of memory cells may be easily determined by utilizing components of the non-volatile memory device, which are used for a reading operation of the plurality of memory cells.

Figure 2:
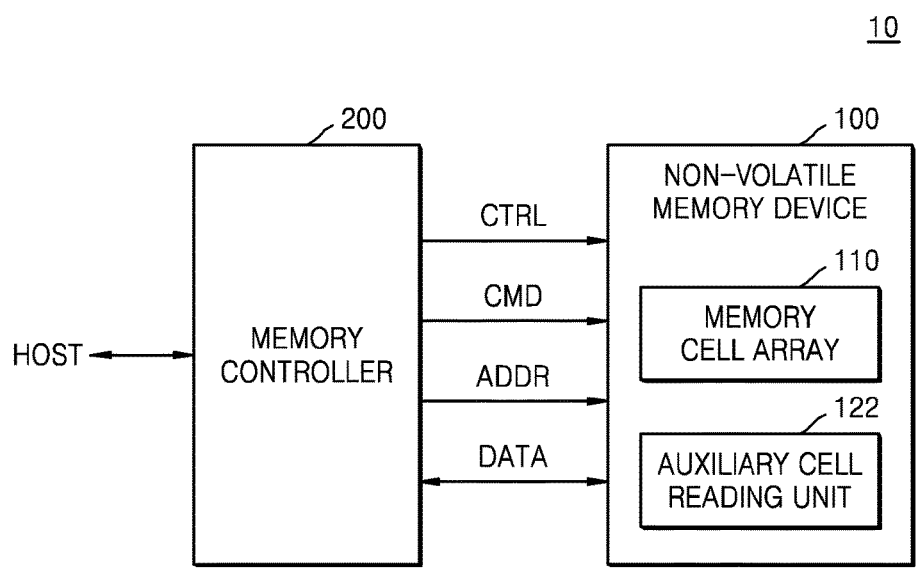
FIG. 2 is a block diagram of a memory system according to an exemplary embodiment.

FIG. 2 is a block diagram of a memory system 10 according to an exemplary embodiment. Referring to FIG. 2, the memory system 10 may include a non-volatile memory device 100 and a memory controller 200. The non-volatile memory device 100 may include a memory cell array 110 and an auxiliary cell reading unit 122.

The memory cell array 110 may include a plurality of strings (not shown). Each of the plurality of strings may include a plurality of memory cells and a plurality of auxiliary cells. According to an exemplary embodiment, the memory cell array 110 may be a three-dimensional (3D) memory array. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" denotes that each layer forming the memory cell array 110 is stacked right above a layer below.

U.S. Pat. No. 7,679,133, No. 8,553,466, No. 8,654,587, No. 8,559,235, and No. 2011/0233648, which are incorporated herein in their entireties, disclose components of the 3D memory array formed of a plurality of levels, wherein word lines and/or bit lines are shared by the plurality of levels. The present specification refers thereto.

According to an exemplary embodiment, the 3D memory array may be vertically arranged such that at least one memory cell is located on another memory cell, and may include vertical NAND strings in which auxiliary cells are arranged above or below the memory cells, wherein at least one memory cell may include a charge trap layer (refer to FIGS. 5 through 7). That is, the plurality of memory cells may be 3D vertical NAND flash memory cells. Hereinafter, exemplary embodiments will be described by focusing on an example in which the plurality of memory cells of the memory cell array 110 are NAND flash memory cells. In other embodiments, the plurality of memory cells may be two dimensional planner NAND flash memory cells. However, the present disclosure is not limited thereto, and according to other embodiments, the plurality of memory cells may be resistive memory cells, such as resistive random access memory (RAM), phase change RAM (PRAM), or magnetic RAM (MRAM).

According to an exemplary embodiment, the memory cell included in the string of the memory cell array 110 may store data that is equal to or greater than 2 bits. According to an exemplary embodiment, the memory cell included in the string of the memory cell array 110 may be a multi-level cell (MLC) storing data of 2 bits. According to another exemplary embodiment, the memory cell included in the string of the memory cell array 110 may be a triple level cell (TLC) storing data of 3 bits. Hereinafter, it will be described that the memory cell included in the string of the memory cell array 110 is the triple level cell (TLC). However, the present disclosure is not limited thereto. For example, according to another exemplary embodiment, the memory cell included in the string of the memory cell array 110 may store data that is equal to or greater than 4 bits. Also, the memory cell included in the string of the memory cell array 110 may be used as a single level cell (SLC) storing data of 1 bit.

The auxiliary cell reading unit 122 may control an operation of reading at least one auxiliary cell included in the string of the memory cell array 110. That is, the auxiliary cell reading unit 122 may control an operation of detecting a threshold voltage of at least one auxiliary cell included in the string of the memory cell array 110. As described above, as the memory cells included in the string of the memory cell array 110 are deteriorated, threshold voltages of the auxiliary cells may be changed, and the deterioration level of the memory cells may be determined based on the threshold voltages of the auxiliary cells.

The memory controller 200 may control the non-volatile memory device 100 to read data stored in the non-volatile memory device 100 or write data to the non-volatile memory device 100, in response to a write/read request from a host HOST. In detail, the memory controller 200 may control write, read, and erase operations with respect to the non-volatile memory device 100, by providing an address ADDR, a command CMD, and a control signal CTRL to the non-volatile memory device 100. Also, data DATA for a program operation and data DATA that is read may be exchanged between the memory controller 200 and the non-volatile memory device 100.

Although not illustrated, the memory controller 200 may include RAM, a processing unit, a host interface, and a memory interface. The RAM may be used as an operation memory of the processing unit, and the processing unit may control an operation of the memory controller 200. The host interface may support a protocol for performing a data exchange between the host HOST and the memory controller 200. For example, the memory controller 200 may be configured to communicate with an external device HOST via at least one of various interface protocols, such as universal serial bus (USB), multi-media card (MMC), peripheral component interconnect express (PCI-E), advanced technology attachment (ATA), serial-ATA, parallel-ATA, small computer system interface (SCSI), enhanced small disk interface (ESDI), and integrated drive electronics (IDE).

Figure 3:
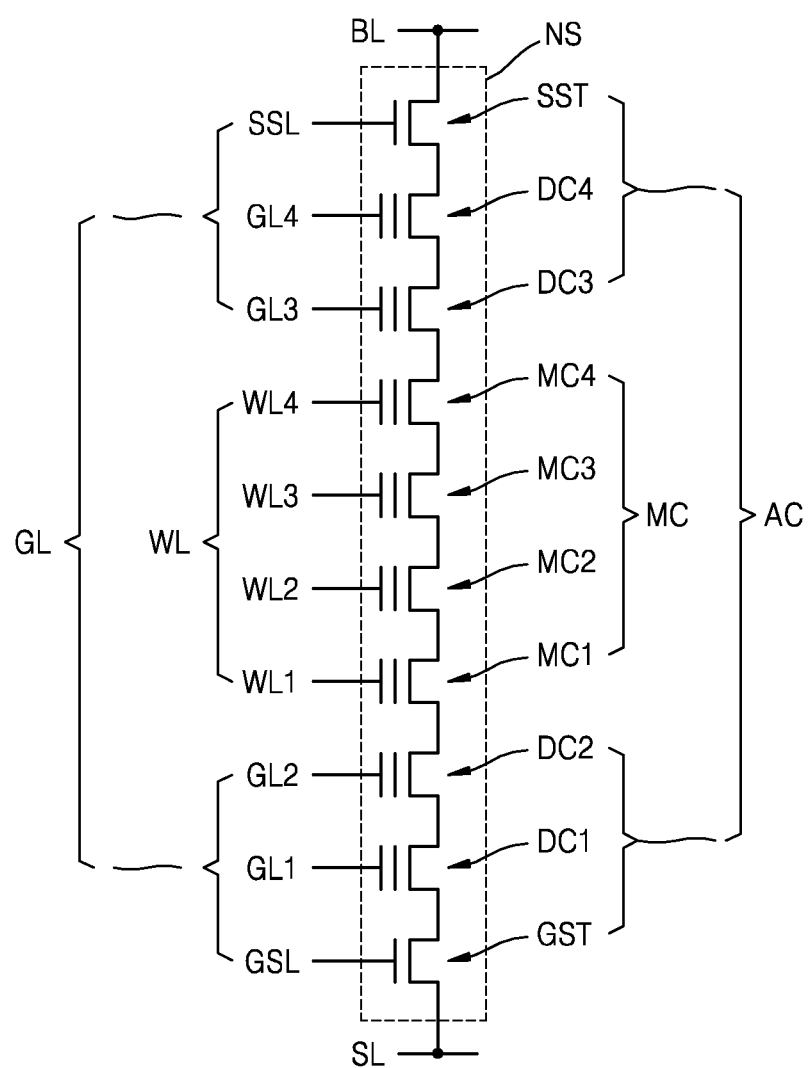
FIG. 3 is a circuit diagram of an example of a string in a memory cell array of FIG. 2, according to an exemplary embodiment.

FIG. 3 is a circuit diagram of an example of the string in the memory cell array 110 of FIG. 2, according to an exemplary embodiment. As described above, the memory cell array 110 may include the plurality of strings, and each of the plurality of strings may include the plurality of memory cells having states corresponding to stored data and the plurality of auxiliary cells supporting an operation with respect to the plurality of memory cells.

Referring to FIG. 3, the ends of a string NS may be connected to a bit line BL and a source line SL, respectively. When an operation of programming or reading memory cells MC included in the string NS is performed, a charge may be supplied to the string NS or released from the string NS via the bit line BL and the source line SL. A charge movement path between the string NS and the bit line BL may be connected or blocked by a string selection transistor SST controlled by a string selection line SSL. Also, the charge movement path between the string NS and the source line SL may be connected or blocked by a ground selection transistor GST controlled by a ground selection line GSL.

Referring to FIG. 3, the string NS may include four memory cells MC and six auxiliary cells AC. The four memory cells MC may be connected in series and the auxiliary cells AC may be connected in series to both ends of the four memory cells MC which are connected in series. The auxiliary cells AC may include dummy cells DC1 through DC4, the string selection transistor SST, and the ground selection transistor GST. The memory cells MC and the auxiliary cells AC may have the same or substantially the same structure by a manufacturing process of the memory cell array 110 including the string NS. For example, as it will be described by referring to FIG. 6, the memory cells MC and the auxiliary cells AC may have the same or substantially the same structure, with only different locations. Accordingly, not only the memory cells MC, but also the auxiliary cells AC may experience a change of a threshold voltage. Also, the auxiliary cells AC may be arranged adjacent to the memory cells MC by being included in the string NS together with the memory cells MC, and thus, the auxiliary cells AC may experience substantially the same factors which cause a physical state change of the memory cells MC.

Although it is illustrated in FIG. 3 that the string NS includes four memory cells and four dummy cells, it will be understood that the present disclosure is not limited thereto. For example, the string included in the memory cell array 110 of FIG. 2 may include eight memory cells, and each end of the string may include more than two dummy cells. Also, although FIG. 3 illustrates that the string NS includes negative channel metal-oxide semiconductor (NMOS) type memory cells and auxiliary cells, the present disclosure is not limited thereto.

The dummy cells DC1 through DC4 of the auxiliary cells AC may protect the memory cells MC from undesirable phenomena when the memory cells MC are programmed or erased. For example, the dummy cells DC1 through DC4 arranged at both ends of the memory cells MC may decrease effects caused by a potential difference between the memory cells MC and the bit line BL and a potential difference between the memory cells MC and the source line SL.

Referring to FIG. 3, the memory cells MC may be connected to word lines WL and the auxiliary cells AC may be connected to gate lines GL. The four memory cells MC1 through MC4 may be connected to four word lines WL1 through WL4, respectively, and the four dummy cells DC1 through DC4 may be connected to four gate lines GL1 through GL4, respectively. Also, the string selection transistor SST and the ground selection transistor GST may be connected to the string selection line SSL and the ground selection line GSL, respectively. The word lines WL connected to the memory cells MC may have different voltages applied according to operations of programming, erasing, and reading the memory cells MC. In particular, during the operation of reading the memory cells MC (that is, during an operation of reading data stored in one of the plurality of memory cells MC), the word line connected to the memory cell from which the data is to be read may have a read voltage applied, and the word lines connected to the rest memory cells may have a pass voltage applied. Unlike the memory cells MC, in general, the four dummy cells DC1 through DC4 are not programmed, erased, or read, and thus, the four gate lines GL1 through GL4 connected to the four dummy cells DC1 through DC4 may be floated, or a pass voltage or an inhibit voltage may be applied to the four gate lines GL1 through GL4.

The method of operating the non-volatile memory device 100 according to an exemplary embodiment may include reading at least one of the auxiliary cells AC, that is, the four dummy cells DC1 through DC4, the string selection transistor SST, and the ground selection transistor GST, by the auxiliary cell reading unit 122. That is, the method of operating the non-volatile memory device 100 may include detecting a threshold voltage of at least one auxiliary cell of the auxiliary cells AC. Hereinafter, the operation of detecting the threshold voltage of at least one of the plurality of auxiliary cells AC will be described in detail.

Figure 4:
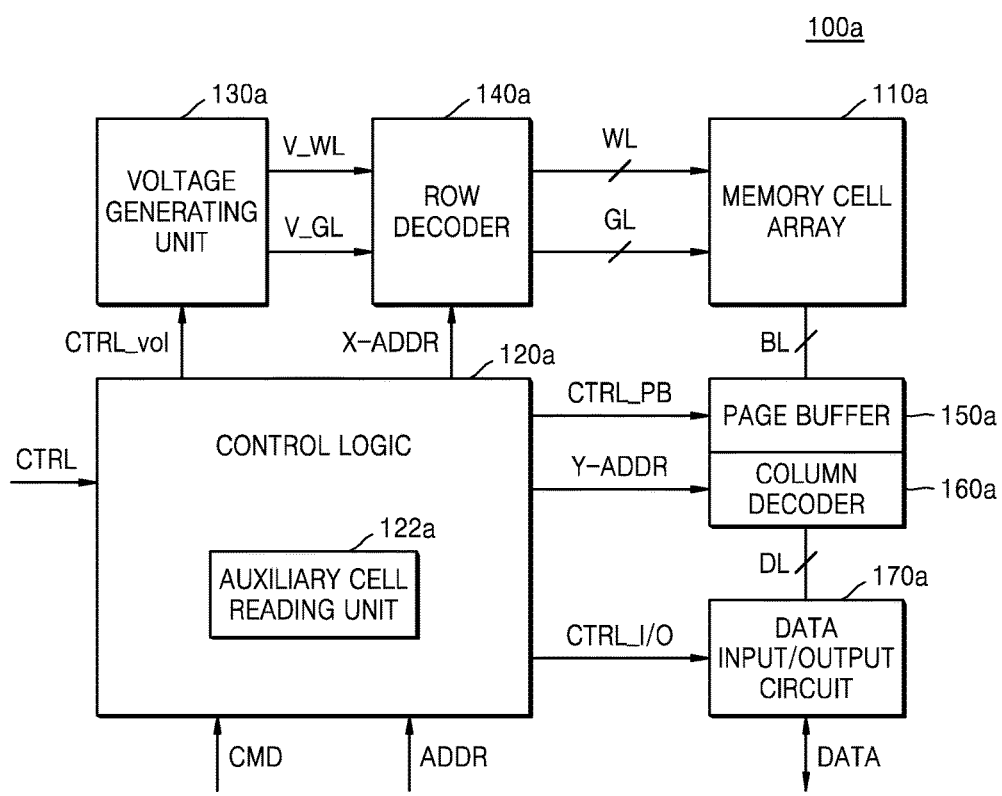
FIG. 4 is a block diagram of an example of a non-volatile memory device included in the memory system of FIG. 2, according to an exemplary embodiment.

FIG. 4 is a block diagram of an example 100a of the non-volatile memory device 100 included in the memory system 10 of FIG. 2, according to an exemplary embodiment. Referring to FIG. 4, the non-volatile memory device 100a may include a memory cell array 110a, a control logic 120a, a voltage generating unit 130a, a row decoder 140a, a page buffer 150a, a column decoder 160a, and a data input/output circuit 170a. Hereinafter, components included in the non-volatile memory device 100a will be described.

The memory cell array 110a may be connected to a plurality of word lines WL, a plurality of gate lines GL, and a plurality of bit lines BL. As described with reference to FIG. 3, the plurality of word lines WL may be connected to the plurality of memory cells, respectively, and the plurality of gate lines GL may be connected to the plurality of auxiliary cells, respectively. The memory cell array 110a may include a string (for example, NS of FIG. 3) including a plurality of memory cells (for example, MC of FIG. 3), and a plurality of auxiliary cells (for example, AC of FIG. 3). Each of the plurality of memory cells may store data of 1 bit or data of multiple bits.

When an erase voltage is applied to the memory cell of the memory cell array 110a, the memory cell is in an erased state, and when a program voltage is applied to the memory cell of the memory cell array 110a, the memory cell is in a programmed state. Here, the memory cell may have the erased state (E) and at least one programmed state, which are separated according to a threshold voltage (Vth).

According to an exemplary embodiment, when the memory cell is used as a single level cell, the memory cell may have an erased state and a programmed state. In other embodiments, the memory cell may have an erased state and one of a plurality of programmed states. For example, when the memory cell is a multi-level cell, the memory cell may have an erased state and one of three programmed states. In other embodiments, when the memory cell is a triple level cell, the memory cell may have an erased state and one of seven programmed states.

The control logic 120a may output various internal control signals to store data in the memory cell array 110a or read data from the memory cell array 110a, based on the command CMD, the address ADDR, and the control signal CTRL received from the memory controller 200a. By this, the control logic 120a may generally control various operations in the non-volatile memory device 100a.

The various internal control signals output by the control logic 120a may be provided to the voltage generating unit 130a, the row decoder 140a, the page buffer 150a, the column decoder 160a, and the data input/output circuit 170a. In detail, the control logic 120a may provide a voltage control signal CTRL_vol to the voltage generating unit 130a, provide a row address X-ADDR to the row decoder 140a, provide a page buffer control signal CTRL_PB to the page buffer 150a, provide a column address Y-ADDR to the column decoder 160a, and provide an input/output control signal CTRL_I/O to the data input/output circuit 170a. However, exemplary embodiments are not limited thereto, and the control logic 120a may further provide other internal control signals to the voltage generating unit 130a, the row decoder 140a, the page buffer 150a, the column decoder 160a, and the data input/output circuit 170a.

The voltage generating unit 130a may generate various types of voltages for performing programming, reading, and erasing operations with respect to the memory cell array 110a, based on the voltage control signal CTRL_vol. In detail, the voltage generating unit 130a may generate a word line driving voltage V_WL for driving the plurality of word lines WL, and a gate line driving voltage V_GL for driving the plurality of gate lines GL. The word line driving voltage V_WL may include a program voltage (or a write voltage), a read voltage, an erase voltage, an inhibit voltage, or a program verify voltage. Referring to FIG. 3, the gate line driving voltage V_GL may include a voltage for driving the gate lines GL1 to GL4 connected to the plurality of dummy cells DC1 to DC4, a voltage for driving a plurality of string selection lines SSL, and a voltage for driving a plurality of ground selection lines GSL.

The row decoder 140a may be connected to the memory cell array 110a via the plurality of word lines WL and the plurality of gate lines GL, and may activate some of the plurality of word lines WL and some of the plurality of gate lines GL in response to a row address X-ADDR received from the control logic 120a. In detail, during a read operation, the row decoder 140a may apply a read voltage to the selected word lines or the selected gate lines, and may apply a non-selection voltage (or a pass voltage) to the non-selected word lines and the non-selected gate lines. Also, during a program operation, the row decoder 140a may apply a program voltage to the selected word lines, and may apply a non-selection voltage (or an inhibit voltage) to the non-selected word lines. According to an exemplary embodiment, during an operation of reading an auxiliary cell, the row decoder 140a may apply a read voltage to at least one of the plurality of gate lines GL, based on a control of the control logic 120a (that is, the auxiliary cell reading unit 122a included in the control logic 120a).

The page buffer 150a may be connected to the memory cell array 110a via the plurality of bit lines BL, and may perform a program operation or a read operation in response to a page buffer control signal CTRL_PB received from the control logic 120a. In detail, during the read operation, the page buffer 150a may operate as a sense amplifier and output a signal corresponding to data stored in the memory cell of the memory cell array 110a, or a signal according to a threshold voltage of the auxiliary cell. During the program operation, the page buffer 150a may operate as a write driver and input data that is to be stored in the memory cell array 110a. The page buffer 150a may be configured to write data to m memory cells of the plurality of memory cells included in the memory cell array 110a, in a parallel method, or to read data from the m memory cells in a parallel method.

Although not shown, the non-volatile memory device 100a may include a multiplexer (not shown), and the multiplexer may be disposed between the memory cell array 110a and the page buffer 150a. The multiplexer may be connected with the memory cell array 110a via the bit lines BL, and may connect some of the bit lines BL to the page buffer 150a, based on an internal control signal received from the control logic 120a.

The column decoder 160a may be connected to the page buffer 150a and may be connected to the input/output circuit 170a via data lines DL. The column decoder 160a may connect some of lines connected to the page buffer 150a with the data lines DL, in response to a column address Y-ADDR received from the control logic 120a.

The data input/output circuit 170a may transmit data DATA that is input from the outside to the column decoder 160a via the data lines DL, or may transmit a signal that is output from the column decoder 160a to the outside of the non-volatile memory device 100a, for example, the controller 200 of FIG. 2, via a plurality of input/output pins or a data bus of the non-volatile memory device 100a.

According to the present exemplary embodiment, the control logic 120a may include the auxiliary cell reading unit 122a. As described with reference to FIG. 2, the auxiliary cell reading unit 122a may control an operation of reading at least one auxiliary cell from among the auxiliary cells included in the string of the memory cell array 110a. In detail, according to an exemplary embodiment, the auxiliary cell reading unit 122a may control the row decoder 140a to apply a read voltage to at least one of the plurality of gate lines GL, and may control the page buffer 150a to output data according to a threshold voltage of the auxiliary cell. The auxiliary cell reading unit 122a may output data that is output from the page buffer 150a to the outside of the non-volatile memory device 100a as an output signal. For example, the auxiliary cell reading unit 122a may output the signal that is output from the page buffer 150a to the outside via the column decoder 160a and the data input/output circuit 170a.

According to the present exemplary embodiment, the auxiliary cell reading unit 122a may be a software module or a hardware module for generating control signals used in the above described auxiliary cell reading operation. For example, the control logic 120a may include a processor and a memory for storing commands executed by the processor, and the auxiliary cell reading unit 122a may be a hardware module or a software module which is stored in the memory. According to another exemplary embodiment, the control logic 120a may be a hardware module, such as finite state machine (FSM), which is triggered by a control signal CTRL or a command CMD.

Figure 5:
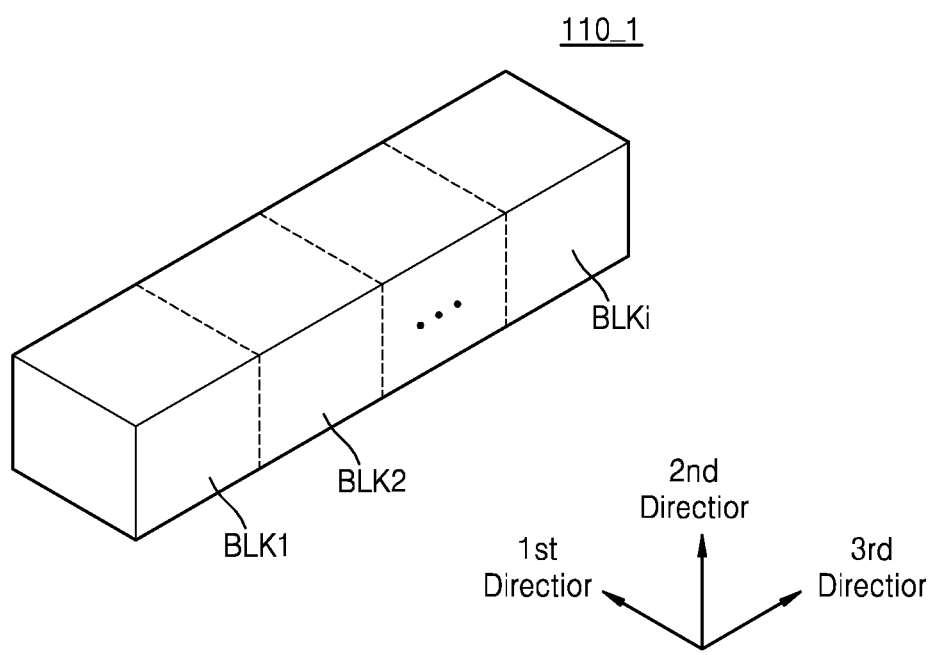
FIG. 5 is a view of an example of a memory cell array included in a non-volatile memory device of FIG. 2, according to an exemplary embodiment.

FIG. 5 is a view of an example 110_1 of the memory cell array 110 included in the non-volatile memory device 100 of FIG. 2, according to an exemplary embodiment. Referring to FIG. 5, the memory cell array 110_1 may include a plurality of memory blocks BLK1 through BLKi.

Each of the plurality of memory blocks BLK through BLKi may have a three dimensional structure (or a vertical structure). In detail, each of the plurality of memory blocks BLK through BLKi may include structures extending in first through third directions. For example, each memory block may include a plurality of strings (e.g., NAND strings) extending in the second direction. Here, the plurality of strings may be formed to be spaced apart from one another by a predetermined distance along the first through third directions.

The plurality of memory blocks BLK1 through BLKi may be selected by the row decoder 140a of FIG. 4. For example, the row decoder 140a may select a memory block corresponding to a block address, from among the memory blocks BLK1 through BLKi. Here, each memory block is connected to the plurality of bit lines BL, the plurality of string selection lines SSL, the plurality of word lines WL, the ground selection line GSL, and a common source line CSL.

The memory blocks BLK1 through BLKi will be described in more detail by referring to FIG. 6.

Figure 6:
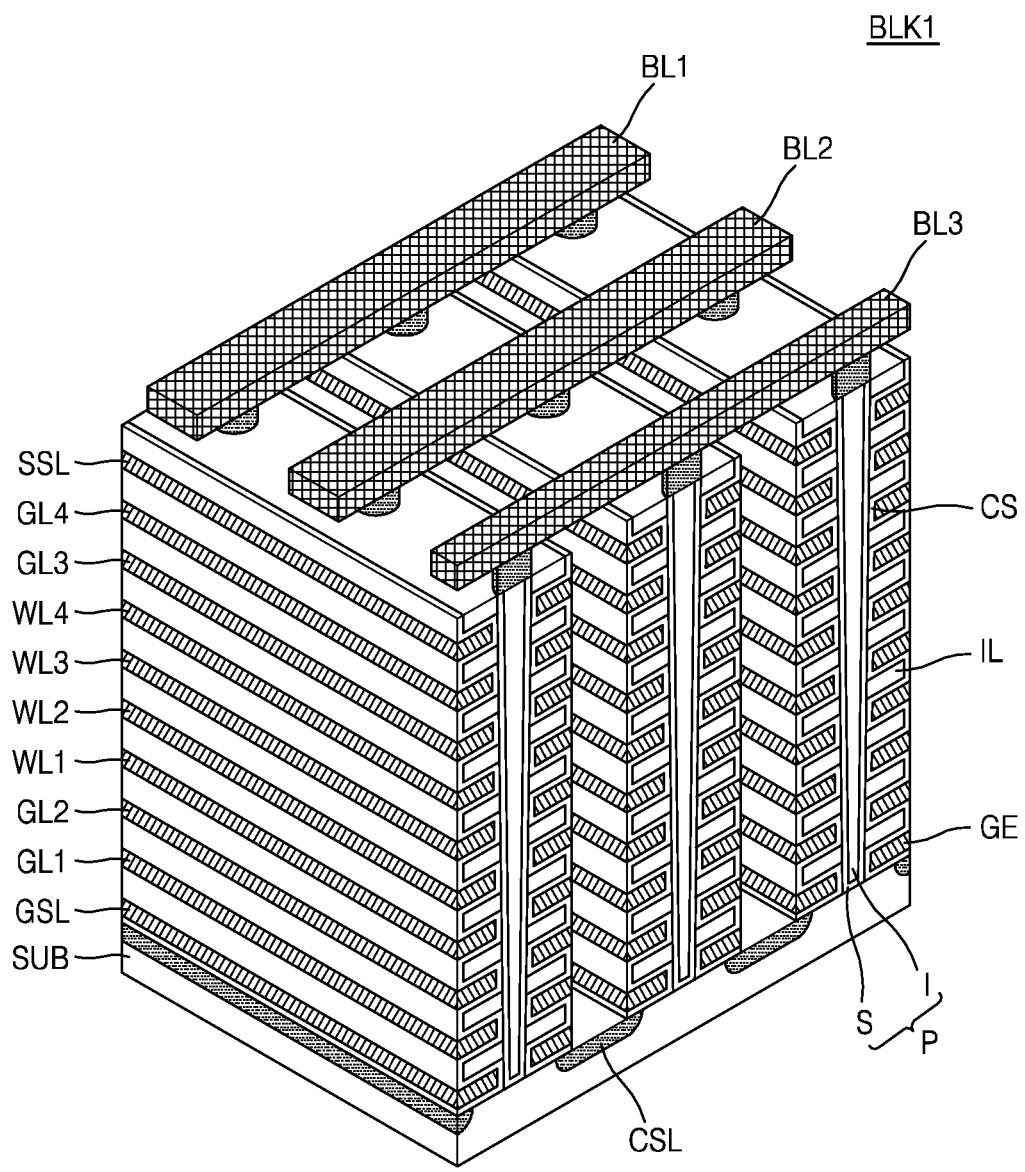
FIG. 6 is a perspective view of an example of a first memory block, which is one of a plurality of memory blocks of FIG. 5, according to an exemplary embodiment.

FIG. 6 is a perspective view of an example of the first memory block BLK1, which is one of the plurality of memory blocks BLK1 through BLKi of FIG. 5, according to an exemplary embodiment. Referring to FIG. 6, the first memory block BLK1 may be formed in a vertical direction with respect to a substrate SUB. FIG. 6 illustrates that the first memory block BLK1 includes two selection lines GSL and SSL, four word lines WL1 through WL4, and three bit lines BL1 through BL3. However, the first memory block BLK1 may include more or less selection lines, word lines, and bit lines.

The substrate SUB may have a first conductive type (for example, a p type), and a common source line CSL extending in the first direction and doped with impurities of a second conductive type (for example, an n type) may be disposed on the substrate SUB. A plurality of insulating layers IL extending in the first direction may be sequentially provided along the second direction on an area of the substrate SUB, the area being between two adjacent common source lines CSL, and the plurality of insulating layers IL may be spaced apart from one another by a predetermined distance along the second direction. For example, the plurality of insulating layers IL may include an insulating material, such as silicon oxide.

A plurality of pillars P sequentially arranged in the first direction and penetrating the plurality of insulating layers IL in the second direction may be formed on the area of the substrate SUB, which is between the two adjacent common source lines CSL. For example, the plurality of pillars P may contact the substrate SUB by penetrating the plurality of insulating layers IL. In detail, a surface layer S of each pillar P may include a silicon material having a first type, and may function as a channel area. Meanwhile, an insulating material, such as silicon oxide, or an air gap may be included in the inside I of each pillar P.

A charge storage layer CS may be formed on the area between two adjacent common source lines CSL, on exposed surfaces of the insulating layers IL, the pillars P, and the substrate SUB. For example, the charge storage layer CS may have an oxide-nitride-oxide (ONO) structure. Also, a gate electrode GE may be provided on an exposed surface of the charge storage layer CS, between two adjacent common source lines CSL. The memory cells connected to the words lines WL1 through WL4, the dummy cells connected to the gate lines GL1 through GL4, the string selection transistor connected to the string selection line SSL, and the ground selection transistor connected to the ground selection line GSL may have the same or substantially the same structures. Accordingly, not only the memory cells, but also the auxiliary cells (the dummy cells, the string selection transistor, and the ground selection transistor) may store a charge in the charge storage layer, and a threshold voltage may be changed according to charges trapped in the charge storage layer.

Drains DR may be disposed on the plurality of pillars P. For example, the drains DR may include a silicon material doped with impurities having a second conductive type. The bit lines BL extending in the third direction and spaced apart from one another by a predetermined distance in the first direction may be disposed on the drains DR.

Figure 7:
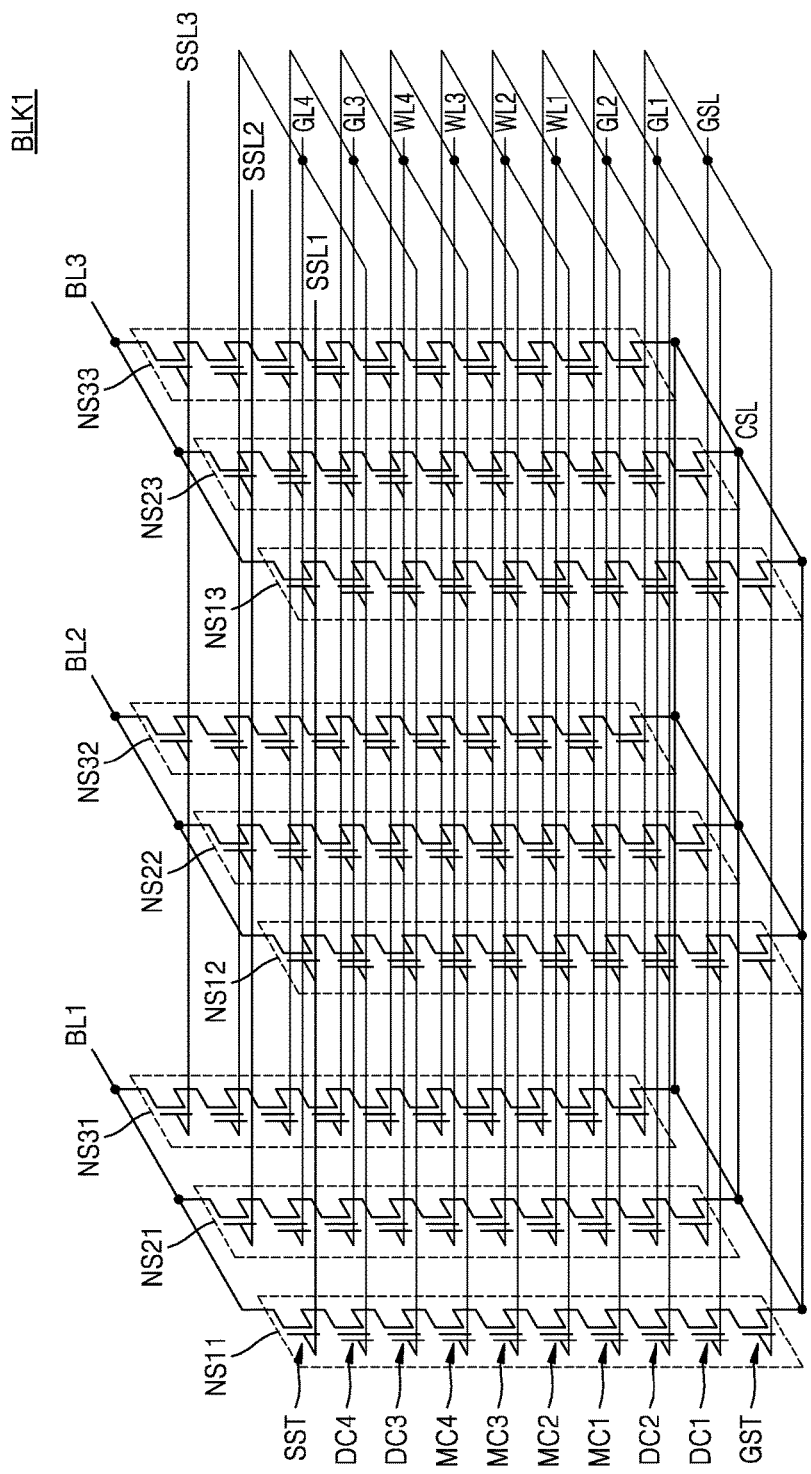
FIG. 7 is a circuit diagram of an equivalent circuit of the first memory block of FIG. 6, according to an exemplary embodiment.

FIG. 7 is a circuit diagram of an equivalent circuit of the first memory block BLK1 of FIG. 6, according to an exemplary embodiment. Referring to FIG. 7, the first memory block BLK1 may be a NAND flash memory having a vertical structure, and each of the memory blocks BLK1 through BLKi of FIG. 5 may correspond to the circuit diagram of FIG. 7.

Referring to FIG. 7, the first memory block BLK1 may include a plurality of NAND strings NS11 through NS33, a plurality of word lines WL1 through WL4, a plurality of gate lines GL1 through GL 4, a plurality of bit lines BL1 through BL3, a ground selection line GSL, a plurality of string selection lines SSL1 through SSL3, and a common source line CSL. The number of NAND strings, the number of word lines, the number of bit lines, the number of ground selection lines, and the number of string selection lines may vary according to exemplary embodiments.

The NAND strings NS11, NS21, and NS31 may be provided between the first bit line BL1 and the common source line CSL, the NAND strings NS12, NS22, and NS32 may be provided between the second bit line BL2 and the common source line CSL, and the NAND strings NS13, NS23, and NS33 may be provided between the third bit line BL3 and the common source line CSL. Each NAND string (for example, NS11) may include a string selection transistor SST, a plurality of memory cells MC1 through MC4, a plurality of dummy cells DC1 through DC4, and the ground selection transistor GST, connected in series. Hereinafter, for convenience, the NAND string may be referred to as the string.

The strings commonly connected to one bit line may form one column. For example, the strings NS11, NS21, and NS31 commonly connected to the first bit line BL1 may correspond to a first column, the strings NS12, NS22, and NS32 commonly connected to the second bit line BL2 may correspond to a second column, and the strings NS13, NS23, and NS33 commonly connected to the third bit line BL3 may correspond to a third column.

The strings connected to one string selection line may form one row. For example, the strings NS11, NS21, and NS31 connected to the first string selection line SSL1 may correspond to a first row, the strings NS12, NS22, and NS32 connected to the second selection line SSL2 may correspond to a second row, and the strings NS13, NS23, and NS33 connected to the third string selection line SSL3 may correspond to a third row.

The plurality of memory cells MC1 through MC4 may be connected to the word lines WL1 through WL4, respectively. The plurality of dummy cells DC1 through DC4 may be connected to the gate lines GL1 through GL4, respectively. The string selection transistor SST may be connected to one of the string selection lines SSL1 through SSL3, and the ground selection transistor GST may be connected to the ground selection line GSL. Also, the string selection transistor SST may be connected to the bit line BL corresponding thereto, and the ground selection transistor GST may be connected to the common source line CSL.

The word lines having the same height (for example, WL1) may be commonly connected, and the string selection lines SSL1 through SSL3 may be separated from one another. A plurality of NAND strings or a plurality of memory cells connected to the same string line from among the plurality of string selection lines SSL1 through SSL3 may be referred to as a plane. For example, the NAND strings NS11, NS12, and NS13 connected to the first string selection line SSL1 may be referred to as the plane.

Memory cells that are to be programmed may be selected by selecting one from among the plurality of string selection lines SSL1 through SSL3, and selecting one from among the plurality of word lines WL1 through WL4. For example, when the first string selection line SSL1 is selected, and a program voltage is applied to the first word line WL1, the memory cells included in the NAND strings NS11, NS12, and NS13 of the first row and connected to the first word line WL1 may be programmed That is, m memory cells selected by one string selection line and one word line may be simultaneously programmed. As shown above, when each of the plurality of memory cells MC1 through MC4 is a single level cell, a data unit which may be simultaneously programmed in the m memory cells may be referred to as a page (or page data), wherein the page is m-bit data. Thus, when each of the memory cells MC1 through MC4 is a triple level cell, the memory cells selected by one string selection line and one word line may store three pages, that is, 3 m-bit data.

Figure 8:
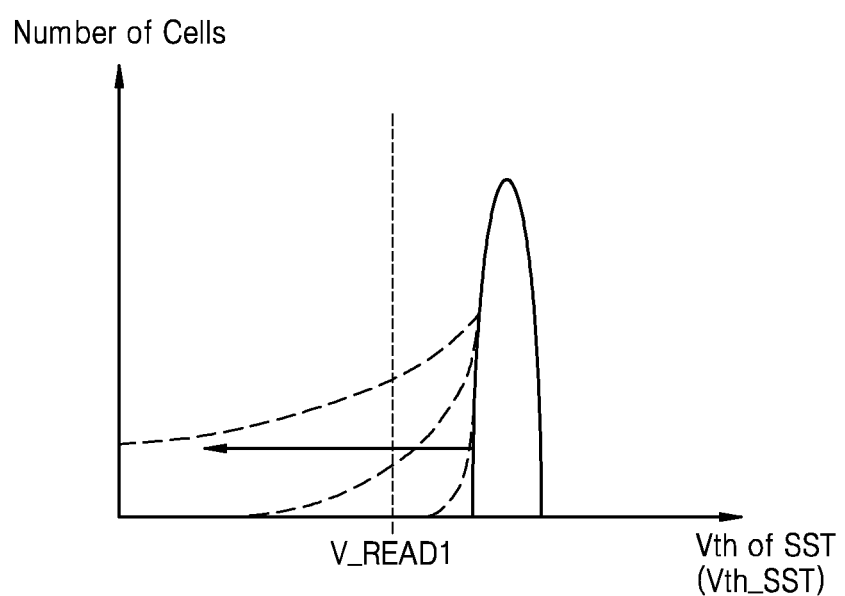
FIG. 8 is a graph showing a threshold voltage distribution of a string selection transistor, according to an exemplary embodiment.

FIG. 8 is a graph showing a distribution of threshold voltages of the string selection transistors SST, according to an exemplary embodiment. In detail, the graph of FIG. 8 shows a shape in which the threshold voltages of the string selection transistors SST are changed as operations of programming and erasing the memory cells MC are repeated. In the graph of FIG. 8, a horizontal axis indicates the threshold voltage Vth of the string selection transistors SST, and a vertical axis indicates the number of string selection transistors SST. Since the string NS may have one string selection transistor SST as illustrated in FIGS. 3, 6, and 7, it may be understood that the vertical axis of FIG. 8 indicates the number of strings.

Referring to FIG. 8, the string selection transistors SST may have a threshold voltage distribution indicated by a solid line, after the non-volatile memory device 100 is manufactured. For example, in a process of manufacturing the non-volatile memory device 100, the string selection transistors SST may be programmed or erased to have the threshold voltage distribution indicated by the solid line of FIG. 8. Experimental results show that the string selection transistors SST have decreased threshold voltages, as indicated by an arrow of FIG. 8, as the programming and erasing operations with respect to the memory cells are repeated. For example, when a cycle of the operations of erasing and programming the memory cell is long, that is, when a time period between the point of completion of the erasing and programming operations and the point of start of next erasing and programming operations is increased, a phenomenon may occur where a positive charge (for example, a hole) moves from the string selection transistor SST towards a negative charge of an adjacent cell. This phenomenon may be referred to as hole lateral-spreading and may cause a reduction of the threshold voltage of the string selection transistor SST.

The method of operating the non-volatile memory device according to an exemplary embodiment may include determining a deterioration level of the memory cell by detecting a reduced threshold voltage of the string selection transistor SST. For example, as illustrated in FIG. 8, the strings NS (or the memory cells MC included in the strings NS) including the string selection transistors SST having threshold voltages which are less than a first read voltage V_READ1, which is a predetermined reference value, may be determined to be deteriorated.

Also, the method of operating the non-volatile memory device according to an exemplary embodiment may include determining a deterioration level of a memory cell group (for example, a memory block) formed of a plurality of memory cells, based on the number of string selection transistors SST (that is, the number of strings NS including the string selection transistor SST) having a reduced threshold voltage. For example, as illustrated in FIG. 8, when the number of string selection transistors SST having the threshold voltage which is less than the first read voltage V_READ1 is greater than a predetermined reference number, it may be determined that the memory block including the plurality of strings is deteriorated.

Figure 9:
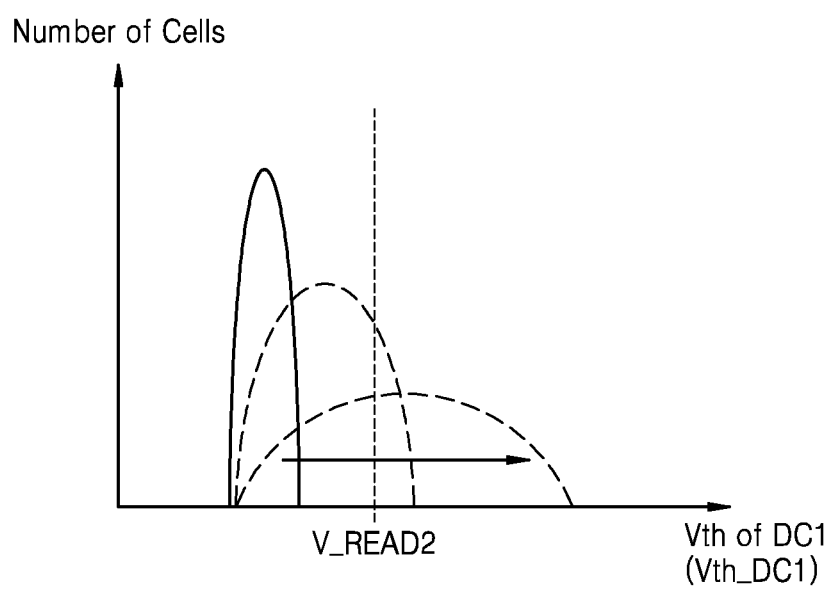
FIG. 9 is a graph of a threshold voltage distribution of a dummy cell, according to an exemplary embodiment.

FIG. 9 is a graph showing a distribution of threshold voltages of the dummy cells, according to an exemplary embodiment. In detail, the graph of FIG. 9 shows a shape in which the threshold voltages of the first dummy cells DC1 disposed most adjacent to the ground selection transistor GST are changed, as the operations of programming and erasing the memory cells MC are repeated. A horizontal axis of the graph of FIG. 9 indicates the threshold voltage Vth of the first dummy cells DC1, and a vertical axis indicates the number of first dummy cells DC1. Since each of the string NS may have one first dummy cell DC1, as illustrated in FIGS. 3, 6, and 7, the vertical axis of the graph of FIG. 9 may be understood to indicate the number of strings.

Referring to FIG. 9, the first dummy cells DC1 may have a threshold voltage distribution indicated by a solid line, after the non-volatile memory device 100 is manufactured. For example, in the process of manufacturing the non-volatile memory device 100, the first dummy cells DC1 may be programmed or erased to have the threshold voltage distribution indicated by the solid line of FIG. 9. Experiment results show that the first dummy cells DC1 have an increased threshold voltage as indicated by an arrow of FIG. 9, as the programming and erasing operations with respect to the memory cells are repeated. For example, as the programming and erasing operations with respect to the memory cells are repeated, a phenomenon may occur where a negative charge (for example, an electron) is accumulated between the first dummy cell DC1 and the ground selection transistor GST. This phenomenon may be referred to as hot carrier injection and may cause an increase of the threshold voltage of the first dummy cell DC1.

The method of operating the non-volatile memory device according to an exemplary embodiment may include determining a deterioration level of the memory cell by detecting an increased threshold voltage of the first dummy cell DC1. For example, as illustrated in FIG. 9, the strings NS (or the memory cells MC included in the strings NS) including the first dummy cells DC1 having threshold voltages which are higher than a second read voltage V_READ2, which is a predetermined reference value, may be determined to be deteriorated.

Also, the method of operating the non-volatile memory device according to an exemplary embodiment may include determining a deterioration level of a memory cell group (for example, a memory block) formed of a plurality of memory cells, based on the number of first dummy cells DC1 (that is, the number of strings NS including the first dummy cell DC1) having an increased threshold voltage. For example, as illustrated in FIG. 9, when the number of first dummy cells DC1 having the threshold voltage which is higher than the second read voltage V_READ2 is greater than a predetermined reference number, it may be determined that the memory block including the plurality of strings is deteriorated.

FIGS. 8 and 9 illustrate the experimental results with respect to the threshold voltages of the string selection transistors SST and the first dummy cells DC1, from among the plurality of auxiliary cells included in the strings NS. However, threshold voltages of other auxiliary cells may also be changed as programming and erasing operations of the memory cells are repeated. For example, a threshold voltage of the fourth dummy cell DC4 may be changed similarly as the threshold voltage of the string selection transistor SST. Hereinafter, exemplary embodiments will be described by using the threshold voltages of the string selection transistors SST and the first dummy cells DC1, from among the plurality of auxiliary cells. However, it will be understood that the present disclosure is not limited thereto.

Figure 10:
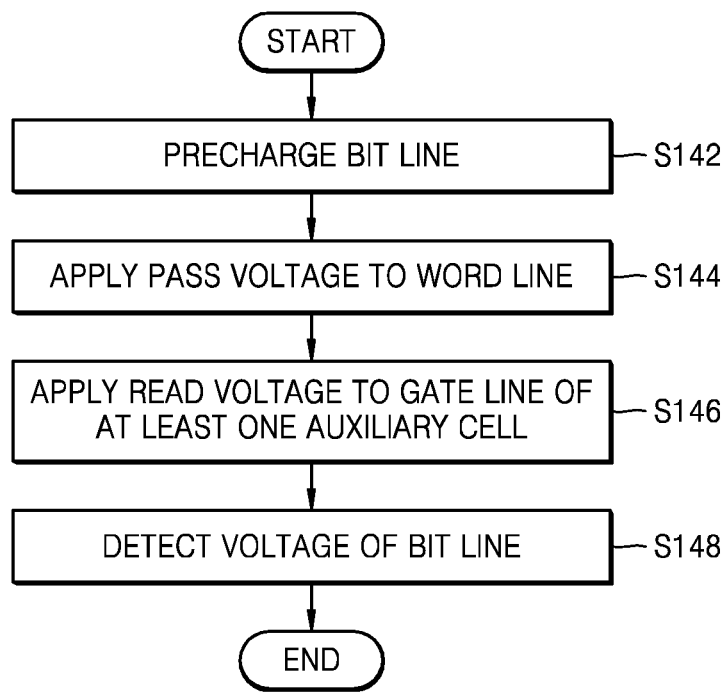
FIG. 10 is a flowchart of an example of an operation illustrated by FIG. 1, according to an exemplary embodiment.

FIG. 10 is a flowchart of an example of the operation S140 of FIG. 1, according to an exemplary embodiment. Referring to FIG. 10, the operation S140 in which a threshold voltage of an auxiliary cell is detected may include four operations S142, S144, S146, and S148. Hereinafter, the example of the operation S140 will be described by referring to FIGS. 3 and 4.

In operation S142, the bit line BL may be precharged. For example, the bit line BL may be precharged as a power voltage VDD. In operation S144, a pass voltage may be applied to the word lines WL. Since the subject of reading (or a subject to detect a threshold voltage from) is the auxiliary cell, the pass voltage may be applied to the word lines WL connected to the memory cells.

In operation S146, a read voltage may be applied to the gate line of at least one auxiliary cell. The read voltage applied to the gate line of the auxiliary cell may be predetermined, and may be the same as or different from a read voltage applied to the word line WL of the memory cell when the memory cell is read. A pass voltage may be applied to the gate lines of the rest of the auxiliary cells except the auxiliary cell which is the subject of reading. Thus, when the ground selection transistor GST is not the subject of reading, a charge movement path may be formed between the string NS and the source line SL having a ground potential, by the ground selection transistor GST.

When the subject of reading is the string selection transistor SST, a first read voltage V_READ1 may be applied to the string selection line SSL, and a pass voltage may be applied to the gate lines GL1 through GL4 connected to the dummy cells DC1 through DC4. Also, a pass voltage (or a voltage for turning on the ground selection transistor GST) may be applied to the ground selection line GSL.

When the subject of reading is the first dummy cell DC1, a second read voltage V_READ2 may be applied to the gate line GL1 connected to the first dummy cell DC1, and a pass voltage may be applied to the gate lines GL2 through GL4 connected to the rest dummy cells DC2 through DC4. Also, a pass voltage (or a voltage for turning on the string selection transistor SST and a voltage for turning on the ground selection transistor GST) may be applied to the string selection line SSL and the ground selection line GSL.

In operation S148, a voltage of the bit line BL may be detected. When a threshold voltage of an auxiliary cell, which is the subject of reading, is lower than an applied read voltage, the auxiliary cell may be an on-cell, and a charge movement path may be formed between the bit line BL and the source line SL. Accordingly, a potential of the bit line BL may be decreased (for example, to a ground potential). On the contrary, when the threshold voltage of the auxiliary cell, which is the subject of reading, is higher than the applied read voltage, the auxiliary cell may be an off-cell, and the charge movement path may be blocked between the bit line BL and the source line SL. Accordingly, the potential of the bit line BL may be substantially maintained. In operation S148, the voltage (or the potential) of the bit line BL may be sensed to determine whether the auxiliary cell is the on-cell or the off-cell so that the threshold voltage of the auxiliary cell may be detected.

Figure 11:
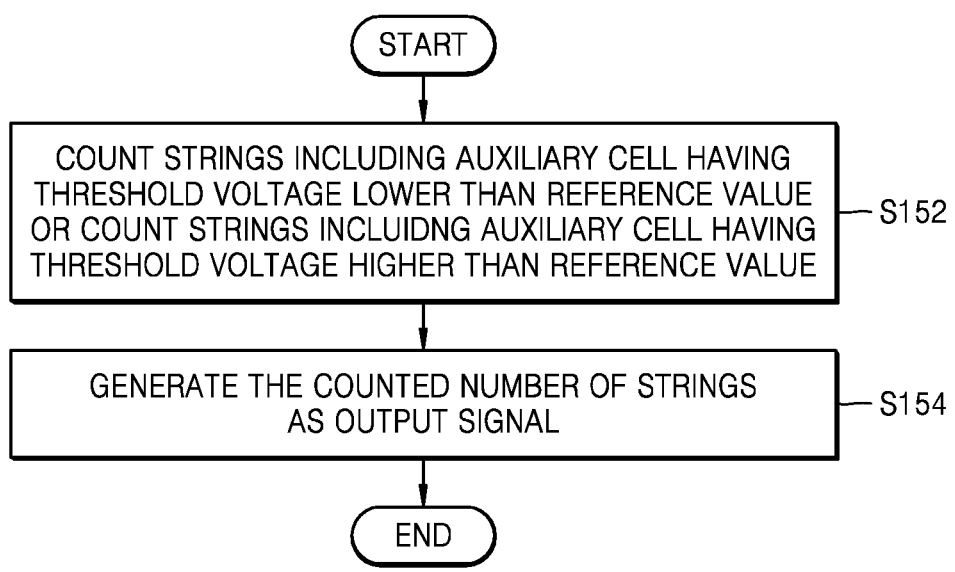
FIG. 11 is a flowchart of an example of an operation illustrated by FIG. 1, according to an exemplary embodiment.

FIG. 11 is a flowchart of an example of the operation S150 of FIG. 1, according to an exemplary embodiment. Referring to FIG. 11, the operation S150 in which an output signal corresponding to a deterioration level of the memory cells is generated may include two operations S152 and S154. Hereinafter, the example of the operation S150 will be described by referring to FIGS. 3 and 4.

In operation S152, the number of strings, including the auxiliary cell, having a threshold voltage which is lower than a predetermined reference value may be counted, or the number of strings, including the auxiliary cell, having a threshold voltage which is higher than the predetermined reference value may be counted. For example, when the subject of reading (or a subject to detect the threshold voltage from) is the string selection transistor SST, the number of strings including the string selection transistor SST having the threshold voltage which is lower than the first read voltage V_READ1 may be counted. As an another example, when the subject of reading is the first dummy cell DC1, the number of strings including the first dummy cell DC1 having the threshold voltage which is higher than the second read voltage V_READ2 may be counted.

In operation S154, the counted number of strings may be generated as the output signal. The output signal corresponding to the counted number of strings may be output to the outside of the non-volatile memory device, or data corresponding to the output signal may be stored in an additional storage unit included in the non-volatile memory device.

Figure 12:
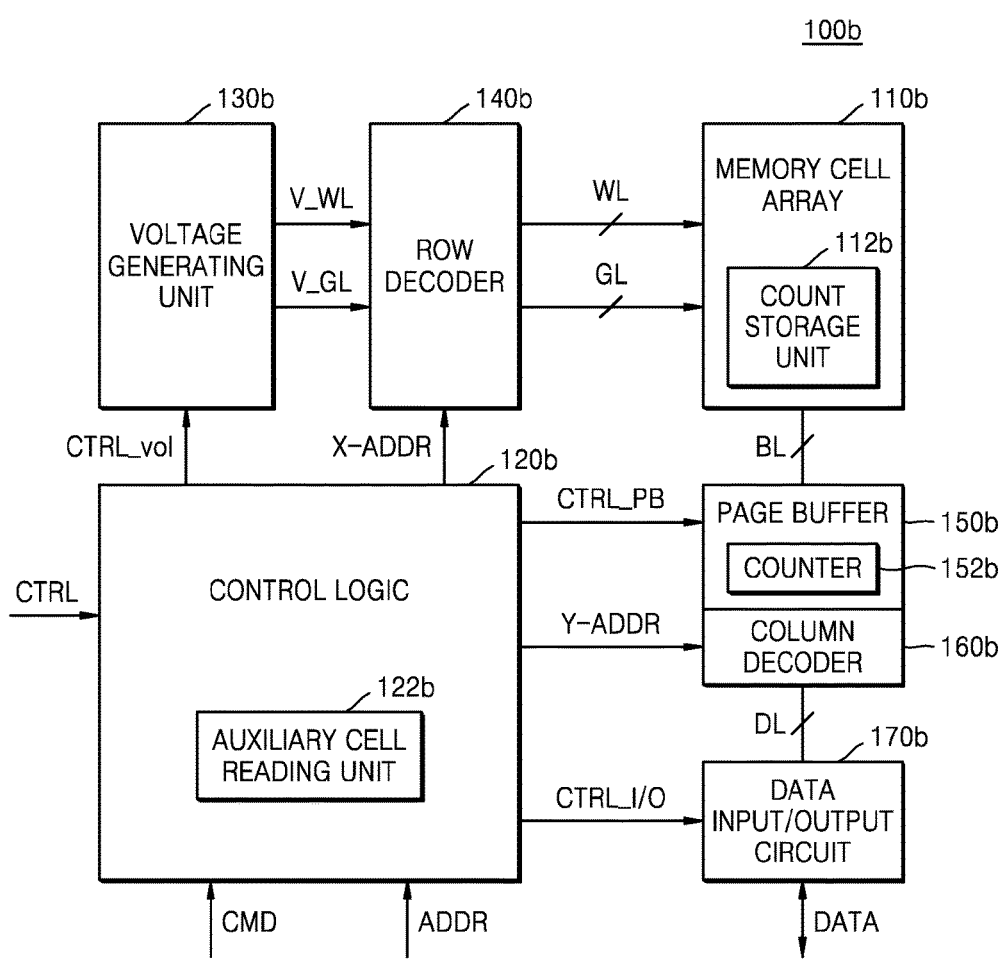
FIG. 12 is a block diagram of an example of a non-volatile memory device included in the memory system of FIG. 2, according to an exemplary embodiment.

FIG. 12 is a block diagram of an example 100b of the non-volatile memory device 100 included in the memory system 10 of FIG. 2, according to an exemplary embodiment. Compared with the non-volatile memory device 100a illustrated in FIG. 4, in the non-volatile memory device 100b of FIG. 12, a memory cell array 110b may include a count storage unit 112b, and a page buffer 150b may include a counter 152b. Hereinafter, components of the non-volatile memory device 100b of FIG. 12, which correspond to the components of the non-volatile memory device 100a of FIG. 4, will not be described.

Referring to FIG. 12, the page buffer 150b may include the counter 152b. As described above with reference to the operation S152 of FIG. 11, the counter 152b may count the number of strings including the auxiliary cell having a threshold voltage which is lower than a reference value, or may count the number of strings including the auxiliary cell having a threshold voltage which is higher than the reference value. For example, the counter 152b may count output signals having a high level or may count output signals having a low level, from among output signals of a sense amplifier for amplifying a voltage of the bit line BL. The output signals that are output by the counter 152b may be output to the outside of the non-volatile memory device 100b via a data input/output circuit 170b, as an output signal of the non-volatile memory device 100b, and as it will be described later, data corresponding to the output signal may be stored in the count storage unit 112b included in the memory cell array 110b.

Referring to FIG. 12, the memory cell array 110b may include the count storage unit 112b. The count storage unit 112b may store information of the counted number of strings counted by the counter 152b. The control logic 120b may output the information of the counted number of strings stored in the count storage unit 112b, to the outside of the non-volatile memory device 100b, in response to a second command or a second control signal received from the outside (for example, the second memory controller 200 of FIG. 2.) of the non-volatile memory device 100b. That is, in order to determine the deterioration level of the memory cell of the non-volatile memory device 100b, the memory controller 200 of FIG. 2 may transmit the second command or the second control signal to the non-volatile memory device 100b, and may receive the information of the counted number of strings from the non-volatile memory device 100b.

FIG. 12 illustrates the example in which the count storage unit 112b is included in the memory cell array 110b. However, according to exemplary embodiments, the count storage unit 112b may be included in the non-volatile memory device 100b, as an independent component. Also, according to exemplary embodiments, the counter 152b may also be included in the non-volatile memory device 100b as an independent component, and may be included in the control logic 120b.

Figure 13:
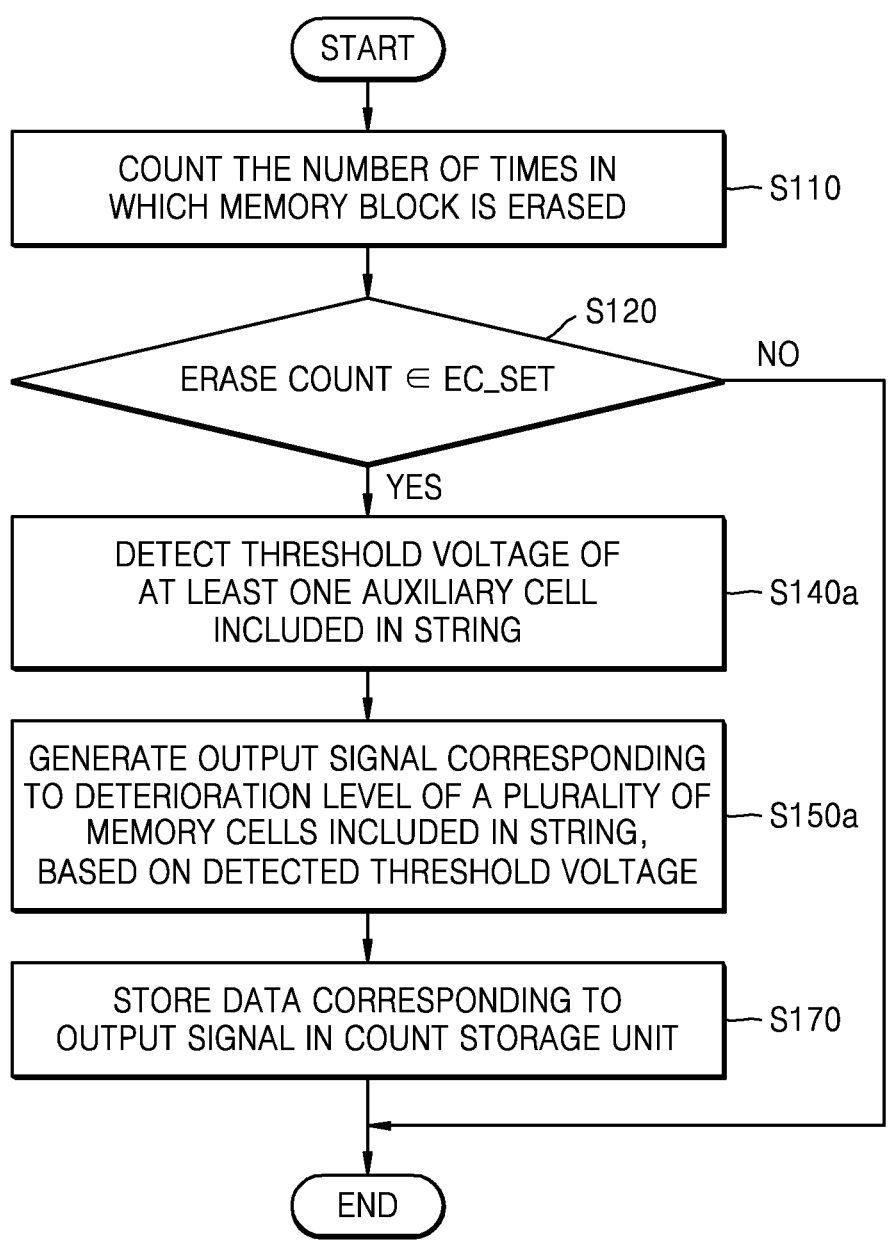
FIG. 13 is a flowchart of an operating method of a non-volatile memory device, according to an exemplary embodiment.

FIG. 13 is a flowchart of a method of operating a non-volatile memory device, according to an exemplary embodiment. In detail, FIG. 13 illustrates an example in which the method of operating the non-volatile memory device illustrated in FIG. 1 is executed when specific conditions are met. The method of operating the non-volatile memory device of FIG. 13 will be described with reference to FIG. 12, and the operations S140a and S150a are substantially the same as the operations S140 and S150 of FIG. 1, respectively, and thus, their detailed descriptions will be omitted.

Referring to FIG. 13, in operation S110, the number of times in which the memory block is erased may be counted. In the case of the non-volatile memory device, such as the NAND flash memory device, the erasing operation may be performed in a memory block unit. For example, when a received command CMD is an erase command, the control logic 120b may control an operation of erasing the memory block of the memory cell array 110b, and the control logic 120b (or the auxiliary cell reading unit 122b) may count the number of times in which the memory block of the memory cell array 110b is erased.

In operation S120, whether the number of times in which the memory block is erased corresponds to one of a plurality of predetermined reference counts may be determined. For example, the auxiliary cell reading unit 122b may store an erase count set EC_SET including the plurality of reference counts as an element, and may determine whether the erase count of the memory block corresponds to one of the reference counts included in the erase count set EC_SET. According to an exemplary embodiment, the plurality of reference counts may be n times an integer which is greater than 1, and in this case, the auxiliary cell reading unit 122b may determine whether a lower bit value of the erase count corresponds to the arbitrary integer, instead of storing the erase count set EC_SET.

When the erase count of the memory block corresponds to one of the plurality of reference counts, the operations (operations S140b and S150a) of detecting the threshold voltage of the auxiliary cell and generating the output signal corresponding to the deterioration level of the memory cell may be performed. Then, in operation S170, the data corresponding to the output signal may be stored in the count storage unit 112b. For example, in operation S150a, the number of strings may be generated as the output signal, and the number of strings corresponding to the output signal may be stored in the count storage unit.

Figure 14:
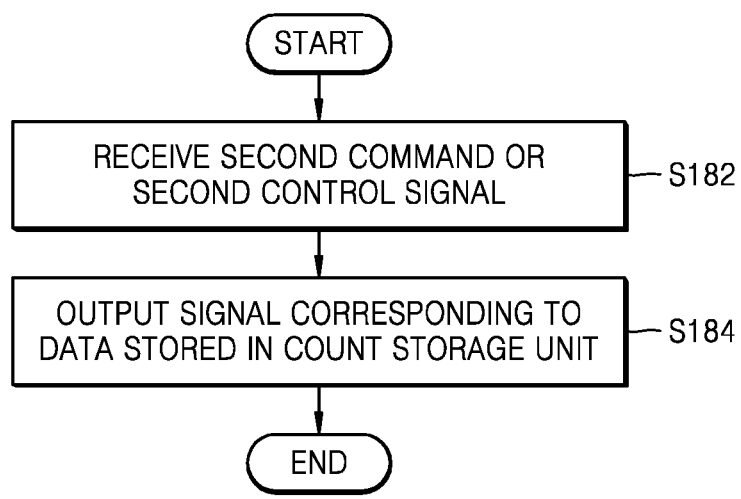
FIG. 14 is a flowchart of an operating method of a non-volatile memory device, according to an exemplary embodiment.

FIG. 14 is a flowchart of a method of operating a non-volatile memory device, according to an exemplary embodiment. In detail, FIG. 14 is the flowchart of the method of operating the non-volatile memory device including the count storage unit 112b as illustrated in FIG. 12. Hereinafter, the method of operating the non-volatile memory device of FIG. 14 will be described with reference to FIG. 12.

In operation S182, a second command or a second control signal may be received. For example, the control logic 120b may receive the second command or the second control signal from the outside (for example, the memory controller 200 of FIG. 2) of the non-volatile memory device 100b.

In operation S184, a signal corresponding to data stored in the count storage unit 112b may be output. For example, the count storage unit 112b may store information of the number of strings, and the control logic 120b (or the auxiliary cell reading unit 122b) may control an operation of outputting a signal corresponding to the number of strings stored in the count storage unit 112b to the outside of the non-volatile memory device 100b.

Figure 15:
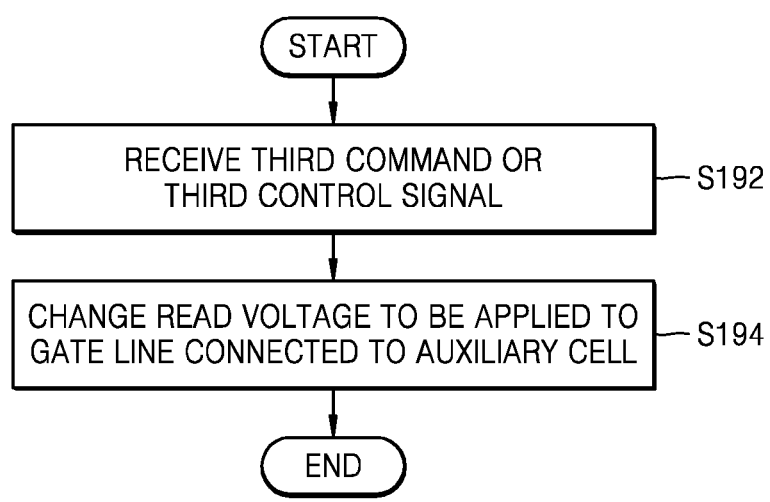
FIG. 15 is a flowchart of an operating method of a non-volatile memory device, according to an exemplary embodiment.

FIG. 15 is a flowchart of a method of operating a non-volatile memory device, according to an exemplary embodiment. In detail, FIG. 15 illustrates the method of operating the non-volatile memory device, in which a read voltage for detecting a threshold voltage of an auxiliary cell is changed. For example, a read voltage applied to a gate line of the auxiliary cell may be adjusted to accurately detect the threshold voltage of the auxiliary cell. Hereinafter, the method operating the non-volatile memory device of FIG. 15 will be described with reference to FIG. 12.

In operation S192, a third command or a third control signal may be received. For example, the control logic 120b may receive the third command or the third control signal from the outside (for example, the memory controller 200 of FIG. 2) of the non-volatile memory device 100b. A trend in which the threshold voltage of the auxiliary cell is changed may be changed, according to a deterioration level of a memory cell. Thus, the memory controller 200 may transmit the third command to change the read voltage based on the deterioration level of the memory cell, so that the non-volatile memory device 100b may detect the threshold voltage of the auxiliary cell based on the changed read voltage. Accordingly, the deterioration level of the memory cell may be more accurately determined.

In operation S194, the read voltage to be applied to a gate line connected to the auxiliary cell may be changed. For example, the auxiliary cell reading unit 122b of the control logic 120b may store information about the read voltage applied to the gate line of the auxiliary cell, and may control the voltage generating unit 130b based on the information about the read voltage, in order to determine the read voltage to be applied to the gate line of the auxiliary cell. In response to the third command or the third control signal received by the control logic 120b, the auxiliary cell reading unit 122b may update the information about the read voltage which is stored, in order to change the read voltage applied to the gate line of the auxiliary cell.

Figure 16:
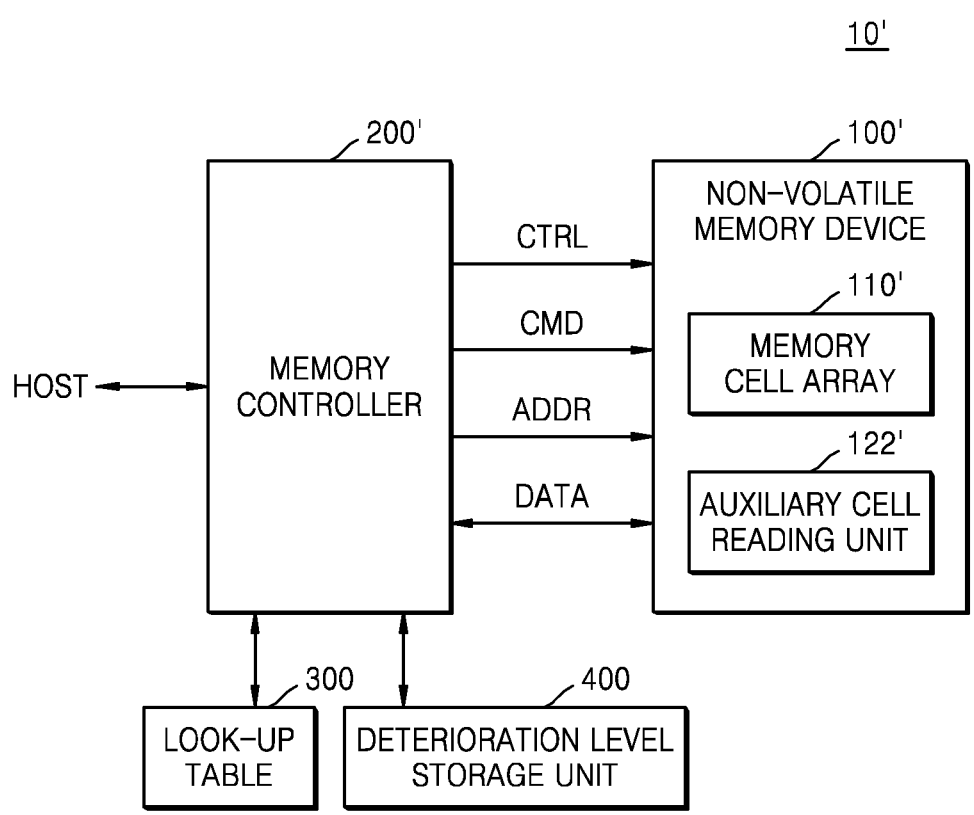
FIG. 16 is a block diagram of a memory system according to an exemplary embodiment.

FIG. 16 is a block diagram of a memory system 10' according to an exemplary embodiment. Referring to FIG. 16, the memory system 10' may include a non-volatile memory device 100', a memory controller 200', a look-up table 300, and a deterioration level storage unit 400. The non-volatile memory device 100' may include a memory cell array 110' and an auxiliary cell reading unit 122'.

The memory controller 200' may access the look-up table 300 and the deterioration level storage unit 400, and may receive data stored in the look-up table 300 and the deterioration level storage unit 400. Also, the memory controller 200' may update the data stored in the deterioration level storage unit 400. The look-up table 300 and the deterioration level storage unit 400 may include a non-volatile memory cell so that data stored in the look-up table 300 and the deterioration level storage unit 400 is not lost even if power supplied in the memory system 10' is blocked.

The memory controller 200' may receive an output signal corresponding to a deterioration level of the memory cell, the output signal being generated by the non-volatile memory device 100', and may determine the deterioration level of the memory cell included in the memory cell array 110' of the non-volatile memory device 100', based on the received output signal and the data stored in the look-up table 300. The memory controller 200' may store data related to the determined deterioration level of the memory cell in the deterioration level storage unit 400, and may control the non-volatile memory device 100' based on the data stored in the deterioration level storage unit 400. Hereinafter, a method of using the look-up table 300 and the deterioration level storage unit 400 via the memory controller 200' will be described in detail by referring to FIGS. 17 and 18.

Figure 17:
FIG. 17 is a view of an example of a look-up table of FIG. 16, according to an exemplary embodiment.

FIG. 17 is a view of an example of the look-up table 300 of FIG. 16, according to an exemplary embodiment.

The memory controller 200' may count the number of times in which the memory block included in the memory cell array 110' of the non-volatile memory device 100' is erased, based on an erase command transmitted to the non-volatile memory device 100'. The memory controller 200' may perform an operation of determining a deterioration level of the memory cell included in the memory cell array 110', when the number of times in which the memory block is erased corresponds to one of predetermined reference counts. The look-up table 300 may be used for the memory controller 200' to determine the deterioration level of the memory cell based on the output signal received from the non-volatile memory device 100'. Referring to FIG. 17, the look-up table 300 may include a column of the number of times in which the memory block is erased, a column REF_S ST of the reference number of a string selection transistor, and a column REF_DC1 of the reference number of a first dummy cell.

The column of the erasing number may include the reference counts which are compared with the number of times in which the memory block is erased, and the column REF_S ST of the reference number of the string selection transistor may include the reference number of the string selection transistor corresponding to the number of times in which the memory block is erased. For example, when the number of times in which the memory block is erased is 100, the reference number of the string selection transistor may be 30, and when the number of string selection transistors having a threshold voltage which is lower than a first read voltage V_READ1 in the memory block is more than 30, based on the output signal received from the non-volatile memory device 100', the memory controller 200' may determine that the memory block (or the memory cells included in the memory block) is deteriorated.

Similarly as the column REF_SST of the reference number of the string selection transistor, the column REF_DC1 of the reference number of the first dummy cell may include the reference number of the first dummy cell corresponding to the number of times in which the memory block is erased. For example, when the number of times in which the memory block is erased is 200, the reference number of the first dummy cell may be 40, and when the number of first dummy cells having a threshold voltage which is higher than a second read voltage V_READ2 in the memory block is more than 40, based on the output signal received from the non-volatile memory device 100', the memory controller 200' may determine that the memory block (or the memory cells included in the memory block) is deteriorated.

Figure 18:
FIG. 18 is a view of an example of a deterioration level storage unit of FIG. 16, according to an exemplary embodiment.

FIG. 18 is a view of an example of the deterioration level storage unit 400 of FIG. 16, according to an exemplary embodiment.

The memory controller 200' may control the non-volatile memory device 100' based on the deterioration level of the memory cell included in the memory cell array 110' of the non-volatile memory device 100'. For example, the memory controller 200' may control the non-volatile memory device 100' by generating an address signal such that a memory cell having a low deterioration level is more frequently used than a memory cell having a high deterioration level. Accordingly, the deterioration level of the memory cells of the memory cell array 110' may be evenly increased, and the reduction of the lifetime of the non-volatile memory device 100' may be prevented. The memory controller 200' may read the data stored in the deterioration level storage unit 400 or update the data stored in the deterioration level storage unit according to the deterioration level of the memory cell, in order to control the non-volatile memory device 100' based on the deterioration level of the memory cell included in the memory cell array 110'. Referring to FIG. 18, the deterioration level storage unit 400 may include a memory block column, a charge loss column, and a hot carrier injection (HCI) column.

The memory block column may include indexes of a plurality of memory blocks included in the memory cell array 110' of the non-volatile memory device 100'. For example, when the memory cell array 110' of the non-volatile memory device 100' includes i memory blocks, the memory block column may include i indexes corresponding to the i memory blocks.

The charge loss column may include information indicating a charge loss level of the memory block corresponding to the index of the memory block column. As described above with reference to FIG. 8, the threshold voltage of the string selection transistor SST may be reduced due to hole lateral-spreading. Thus, the memory controller 200' may, based on the output signal received from the non-volatile memory device 100', and data included in the column REF_SST of the reference number of the string selection transistor of the look-up table 300, determine the charge loss level of the memory block according to the number of strings selection transistors SST (or the number of strings NS having the string selection transistors SST) having a threshold voltage that is lower than a predetermined reference value (for example, the first read voltage V_READ1) in the memory block, and may store the information about the charge loss level of the memory block in the deterioration level storage unit 400.

The HCI column may include information indicating an HCI level of the memory block corresponding to the index of the memory block column. As described above with reference to FIG. 9, the threshold voltage of the first dummy cell DC1 may rise due to the HCI, etc. Thus, based on the output signal received from the non-volatile memory device 100' and data included in the column REF_DC1 of the reference number of the first dummy cell of the look-up table 300, the memory controller 200' may determine the HCI level of the memory block according to the number of first dummy cells DC1 (or the number of strings NS having the first dummy cell DC1) having a threshold voltage that is higher than a predetermined reference value (for example, the second read voltage V_READ2) in the memory block, and may store the information about the HCI level of the memory block in the deterioration level storage unit 400.

The memory controller 200' may select a memory block to erase based on the data stored in the deterioration level storage unit 400 and may generate a free block by erasing the selected memory block. Also, the memory controller 200' may select a memory block to write data, that is an active block, from among free blocks, based on the data stored in the deterioration level storage unit 400, and may write data to the selected memory block. For example, the memory controller 200' may perform garbage collection with respect to the non-volatile memory device 100'. The garbage collection may include operations of copying data among memory blocks, and generating free blocks by erasing memory blocks. The memory controller 200' may select a memory block including a memory cell having a low deterioration level and may erase the selected memory block to generate a free block. For example, referring to FIG. 18, the memory controller 200' may select a second memory block BLK2 having a low deterioration level, based on the data stored in the deterioration level storage unit 400, and may generate a free block by erasing the second memory block BLK2. The memory controller 200' may designate different weights to the charge loss column and the HCI column, and may select the memory block to erase or write data, based on the data stored in the deterioration level storage unit 400 and values calculated according to the weights.

Figure 19:
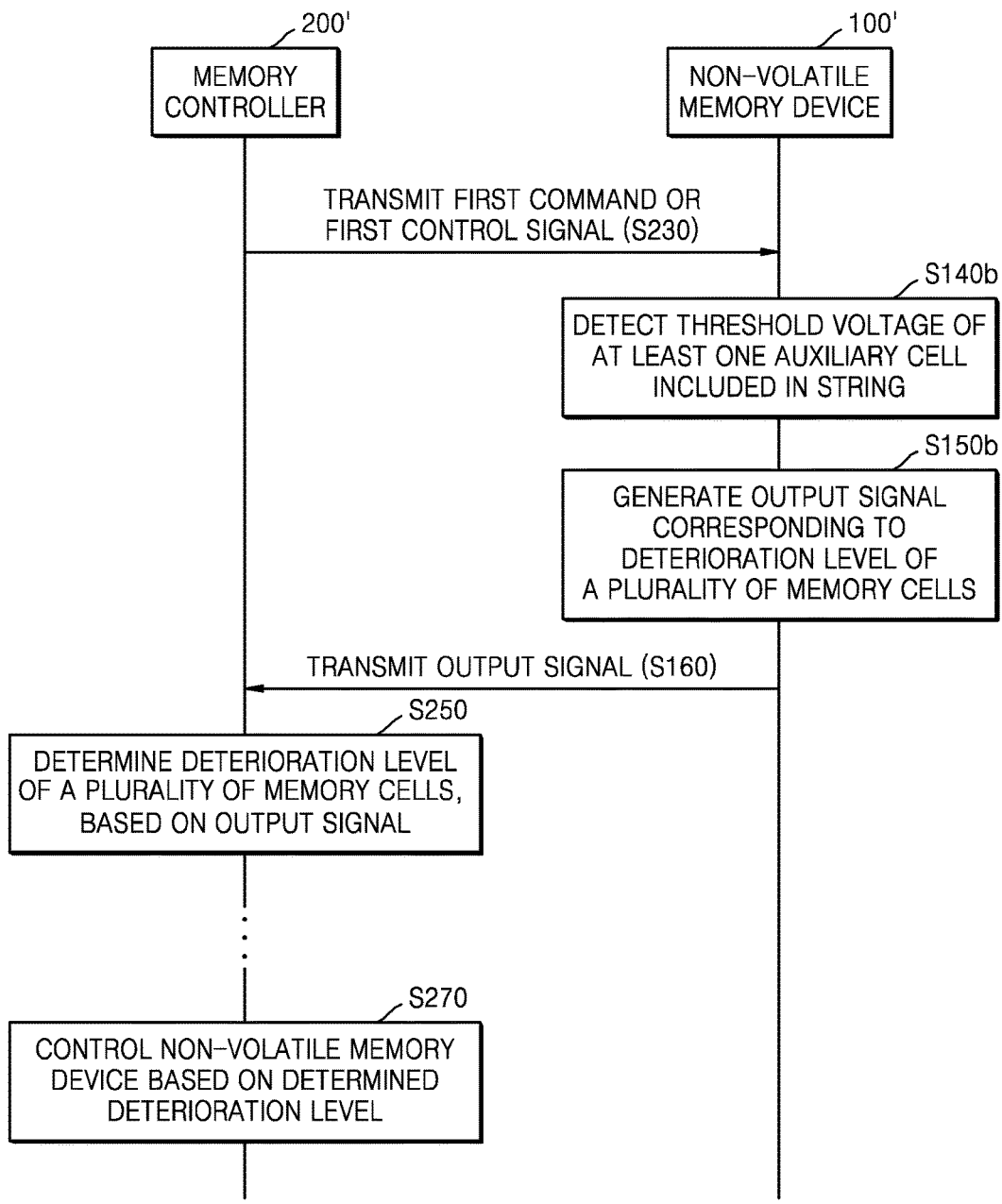
FIG. 19 is a view of an operating method of the memory system of FIG. 16, according to an exemplary embodiment.

FIG. 19 is a view of a method of operating the memory system 10' of FIG. 16, according to an exemplary embodiment. Hereinafter, the method of operating the memory system 10' of FIG. 19 will be described by referring to FIG. 16.

Referring to FIG. 19, the memory controller 200' may transmit a first command or a first control signal to the non-volatile memory device 100' (S230). For example, the memory controller 200' may transmit the first command or the first control signal to the non-volatile memory device 100' in order to determine a deterioration level of memory cells included in the memory cell array 110' of the non-volatile memory device 100'.

In operation S140b, the non-volatile memory device 100' may detect a threshold voltage of at least one auxiliary cell included in each of a number of strings, in response to the received first command or first control signal. For example, the non-volatile memory device 100' may detect a threshold voltage of a string selection transistor or a first dummy cell included in each string. According to an exemplary embodiment, the first command or the first control signal may be accompanied by an index indicating an auxiliary cell to detect a threshold voltage from. That is, the non-volatile memory device 100' may receive the first command or the first control signal accompanied by the index indicating the auxiliary cell, from the memory controller 200', and, based on the index, may select the auxiliary cell to detect (that is, to read) the threshold voltage from. For example, the index indicating the auxiliary cell may be transmitted to the non-volatile memory device 100' by an address signal.

In operation S150b, the non-volatile memory device 100' may generate an output signal corresponding to a deterioration level of a number of memory cells. For example, the non-volatile memory device 100' may compare a predetermined reference value with the threshold voltage of the auxiliary cell of each string, and may generate the number of auxiliary cells having a threshold voltage that is higher than the reference value or the number of auxiliary cells having a threshold voltage that is lower than the reference value, as the output signal.

In operation S160, the non-volatile memory device 100' may transmit the generated output signal to the memory controller 200'. The memory controller 200' may receive the output signal generated by the non-volatile memory device 100' in response to the first command or the first control signal transmitted to the non-volatile memory device 100'.

In operation S250, the memory controller 200' may determine the deterioration level of the plurality of memory cells based on the received output signal. For example, the memory controller 200' may determine a deterioration level of a memory block including the plurality of memory cells, based on the received output signal and the data stored in the look-up table 300. Also, the memory controller 200' may store information related to the determined deterioration level of the memory block in the deterioration level storage unit 400.

In operation S270, the memory controller 200' may control the non-volatile memory device based on the determined deterioration level. For example, the memory controller 200' may access the deterioration level storage unit 400 in which the information related to the deterioration level of the memory block is stored, and may perform garbage collection, etc. with respect to the non-volatile memory device 100', based on the data stored in the deterioration level storage unit 400.

Figure 20:
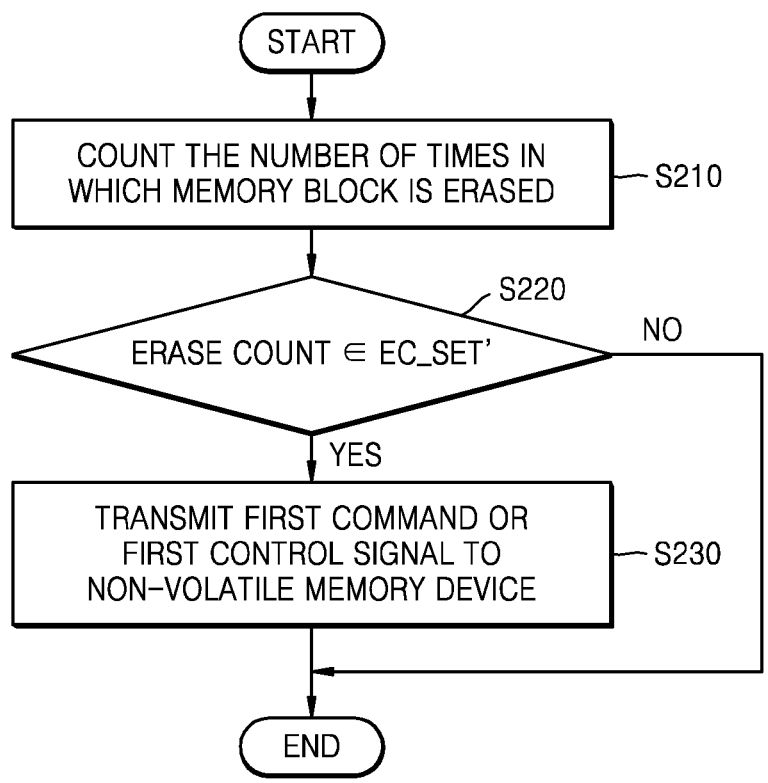
FIG. 20 is a flowchart of an operating method of the memory system of FIG. 16, according to an exemplary embodiment.

FIG. 20 is a flowchart of a method of operating the memory system 10' of FIG. 16, according to an exemplary embodiment. In detail, FIG. 20 is the flowchart of the process of transmitting the first command or the first control signal via the memory controller 200'. The method of operating the memory system 10' of FIG. 20 will be described with reference to FIG. 16.

In operation S210, the memory controller 200' may count the number of times the memory block is erased. For example, the memory controller 200' may transmit an erase command to the non-volatile memory device 100' in order to erase the memory block, and may transmit an address signal corresponding to the memory block. The memory controller 200' may increase the erase count of the memory block, when a signal indicating that the erasing of the memory block is completed is received from the non-volatile memory device 100'.

In operation S220, the memory controller 200' may determine whether the erase count of the memory block corresponds to one of a plurality of predetermined reference counts. For example, the memory controller 200' may store an erase count set EC_SET' including the plurality of reference counts as elements, and may determine whether the erase count of the memory block corresponds to one of the reference counts included in the erase count set EC_SET'. According to an exemplary embodiment, the plurality of reference counts may be n times an integer that is greater than 1, and in this case, the memory controller 200' may determine whether a lower bit value of the erase count corresponds to the arbitrary integer, instead of storing the erase count set EC_SET'.

When the erase count of the memory block corresponds to one of the plurality of reference counts, the memory controller 200' may transmit the first command or the first control signal to the non-volatile memory device 100', in operation S230. As described above with reference to FIG. 19, the non-volatile memory device 100' may generate the output signal in response to the received first command or first control signal, and may transmit the output signal to the memory controller 200'.

Figure 21:
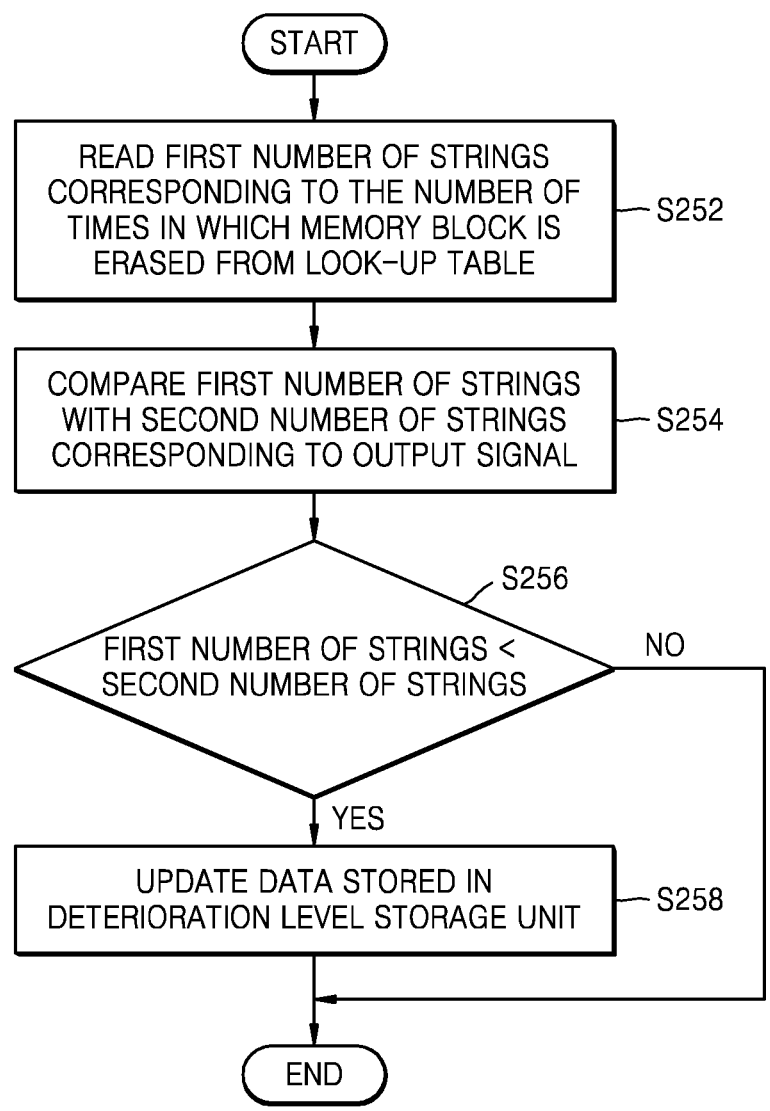
FIG. 21 is a flowchart of an example of an operation illustrated by FIG. 19, according to an exemplary embodiment.

FIG. 21 is a flowchart of an example of the operation S250 of FIG. 19, according to an exemplary embodiment. In operation S250 of FIG. 19, the memory controller 200' may determine the deterioration level of the plurality of memory cells based on the received output signal. Hereinafter, the example of the operation S250 of FIG. 19 illustrated in FIG. 21 will be described with reference to FIG. 16.

In operation S252, the memory controller 200' may read the first number of strings corresponding to the number of times in which the memory block is erased, from the look-up table 300. For example, when the number of times in which the memory block is erased is 250, and the memory controller 200' accesses the look-up table 300 illustrated in FIG. 17, the memory controller 200' may read 70 as the first number of strings.

In operation S254, the memory controller 200' may compare the first number of strings read from the look-up table 300 with second number of strings corresponding to the output signal received from the non-volatile memory device 100'. When the second number of strings is greater than the first number of strings in operation S256, the memory controller 200' may update the data stored in the deterioration level storage unit 400 in operation S258. For example, when the memory controller 200' determines that the first memory block BLK1 is deteriorated by accessing the deterioration level storage unit 400 illustrated in FIG. 18 and detecting the threshold voltage of the string selection transistor, the memory controller 200' may change a value of a charge loss column corresponding to the first memory block BLK1 to "bad" or "medium" in the deterioration level storage unit 400.

Figure 22A:
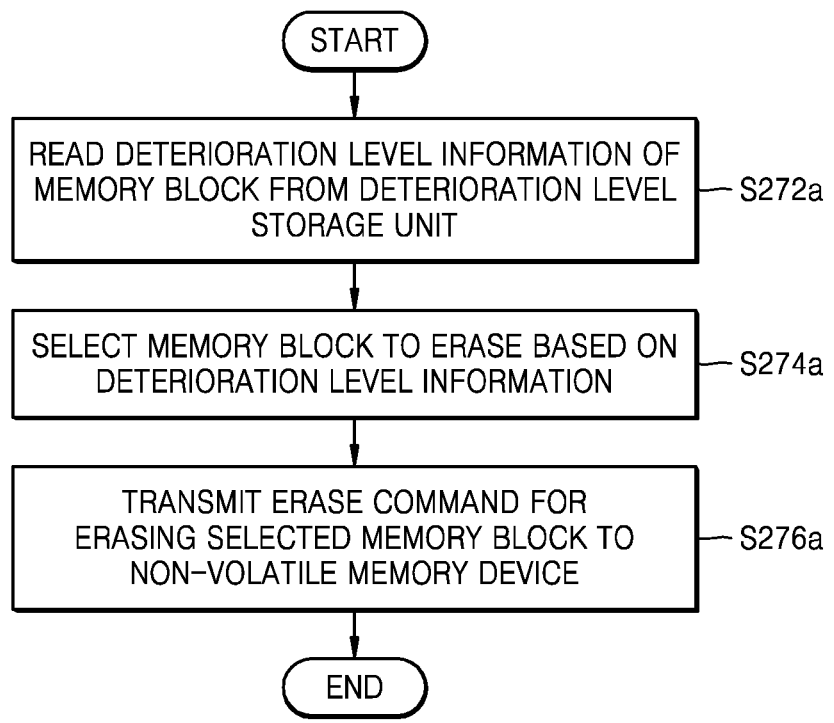
FIGS. 22A and 22B are flowcharts of examples of an operation illustrated by FIG. 19, according to exemplary embodiments.
Figure 22B:
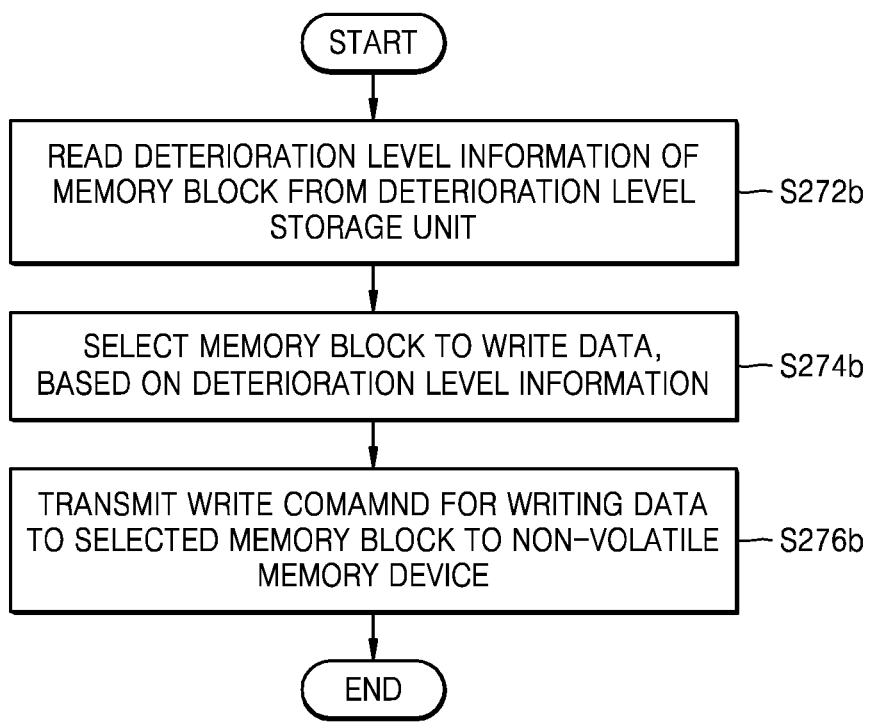

FIGS. 22A and 22B are flowcharts of examples of the operation S270 of FIG. 19, according to exemplary embodiments. In operation S270 of FIG. 19, the memory controller 200' may control the non-volatile memory device based on the determined deterioration level. In detail, FIG. 22A illustrates an example in which the memory controller 200' generates a free block based on the deterioration level, and FIG. 22B illustrates an example in which the memory controller 200' selects an active block based on the deterioration level. In order to generate the free block or to select the active block, the examples of the operation S270 illustrated in FIGS. 22A and 22B may include an operation, such as garbage collection, etc. as a method of using the deterioration level information of the memory block stored in the deterioration level storage unit 400. Hereinafter, the examples of the operation S270 of FIG. 19, illustrated in FIGS. 22A and 22B, will be described with reference to FIG. 16.

Referring to FIG. 22A, in operation S272a, the memory controller 200' may read deterioration level information of the memory block from the deterioration level storage unit 400. For example, when the memory controller 200' accesses the deterioration level storage unit 400 illustrated in FIG. 18, the memory controller 200' may read the deterioration level information of the first through $i^{th}$ memory blocks BLK1 through BLKi.

In operation S274a, the memory controller 200' may select a memory block to erase, based on the deterioration level information. For example, the memory controller 200' may select the second memory block BLK2 having the lowest deterioration level as the memory block to erase, based on the deterioration level information read from the deterioration level storage unit 400 of FIG. 18.

In operation S276a, the memory controller 200' may transmit an erase command for erasing the selected memory block to the non-volatile memory device 100'. For example, the memory controller 200' may transmit an address signal corresponding to the selected memory block and the erase command.

Referring to FIG. 22B, in operation S272b, the memory controller 200' may read the deterioration level information of the memory block from the deterioration level storage unit 400. For example, when the memory controller 200' accesses the deterioration level storage unit 400 illustrated in FIG. 18, the memory controller 200' may read the deterioration level information of the first through $i^{th}$ memory blocks BLK1 through BLKi.

In operation S274b, the memory controller 200' may select a memory block to write data based on the deterioration level information. For example, the memory controller 200' may select the second memory block BLK2 having the lowest deterioration level as the memory block to write data, based on the deterioration level information read from the deterioration level storage unit 400 of FIG. 18.

In operation S276b, the memory controller 200' may transmit a write command for writing data to the selected memory block to the non-volatile memory device 100'. For example, the memory controller 200' may transmit an address signal corresponding to the selected memory block, data to write, and the write command.

Figure 23:
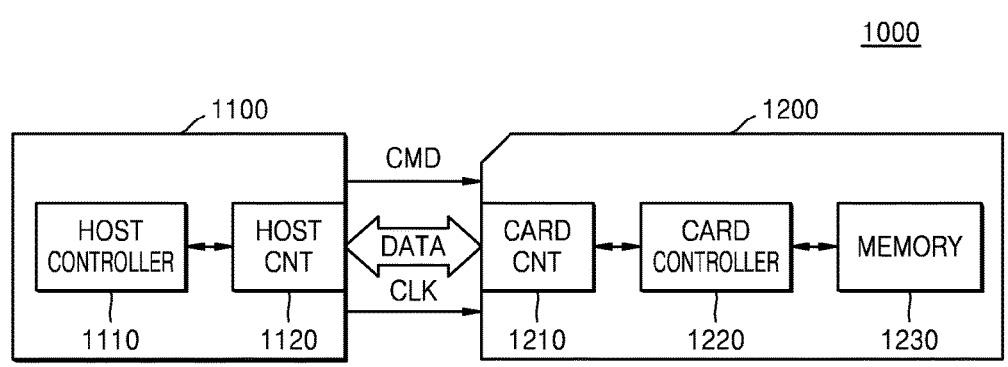
FIG. 23 is a block diagram of an example of using a memory system in a memory card system, according to exemplary embodiments.

FIG. 23 is a block diagram of an example in which the memory systems 10 and 10' according to the exemplary embodiments are applied to a memory card system 1000. Referring to FIG. 23, the memory card system 1000 may include a host 1100 and a memory card 1200.

The host 1100 may include a host controller 1110 and a host contact unit 1120. The memory card 1200 may include a card contact unit 1210, a card controller 1220, and a memory device 1230. Here, the memory card 1200 may be realized by using the memory system according to any one of the exemplary embodiments illustrated in the accompanying drawings of this specification. As shown in the exemplary embodiments, the deterioration level of the memory cell included in the memory device 1230 may be accurately and easily determined, and thus, the durability of the memory card 1200 may be improved, and the reduction of the lifetime of the memory card 1200 may be prevented.

The host 1100 may store data in the memory card 1200 or read data stored in the memory card 1200. The host controller 1100 may transmit a command CMD, a clock signal CLK generated by a clock generator (not shown) in the host 1100, and data DATA to the memory card 1200 via the host contact unit 1120.

The card controller 1220 may store data in the memory device 1230 by synchronizing the data with the clock signal generated by the clock generator in the card controller 1220, in response to the command received by the card contact unit 1210. The memory device 1230 may store the data transmitted from the host 1100.

The memory card 1200 may be realized, for example, as a compact flash card (CFC), a micro-drive, a smart media card (SMC), a multimedia card (MMC), a security digital card (SDC), a memory stick, and a USB flash memory driver.

Figure 24:
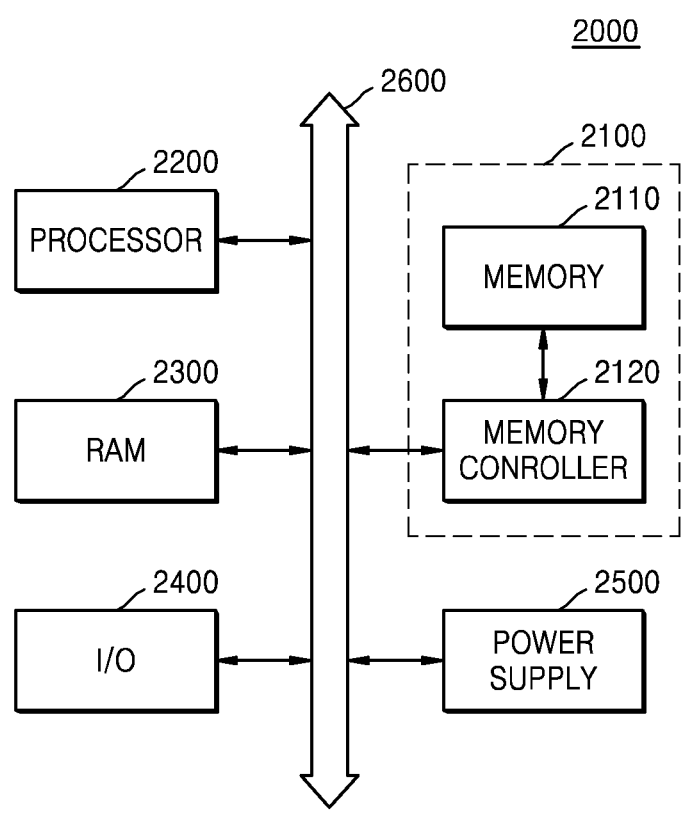
FIG. 24 is a block diagram of a computing system including a memory system according to exemplary embodiments.

FIG. 24 is a block diagram of a computing system 2000 including a memory system 2100 according to exemplary embodiments. Referring to FIG. 24, the computing system 2000 may include the memory system 2100, a processor 2200, RAM 2300, an input/output device 2400, and a power device 2500. Although not illustrated in FIG. 24, the computing system 2000 may further include ports via which communication with a video card, a sound card, a memory card, a USB device, or other electronic devices may be realized. The computing system 2000 may be realized as a personal computer, or portable electronic devices, such as a notebook computer, a cellular phone, a personal digital assistant, and a camera.

The processor 2200 may perform specific calculations or tasks. According to exemplary embodiments, the processor 2200 may be a micro-processor or a central processing unit (CPU). The processor 2200 may perform communication with the RAM 2300, the input/output device 2400, and the memory system 2100 via a bus 2600, such as an address bus, a control bus, and a data bus. Here, the memory system 2100 may be realized according to any one of the exemplary embodiments illustrated in the accompanying drawings of this specification. According to the exemplary embodiments, the deterioration level of the memory cell included in a memory device 2110 may be accurately and easily determined, with a memory controller 2120. Thus, the durability of the memory system 2100 may be improved, and the lifetime of the memory system 2100 may be increased. The processor 2200 may be connected to an extension bus, such as a peripheral component interconnect (PCI) bus.

The RAM 2300 may store data necessary for an operation of the computing system 2000. For example, the RAM 2300 may be realized as DRAM, mobile DRAM, SRAM, PRAM, FRAM, RRAM, and/or MRAM.

The input/output device 2400 may include an input device, such as a keyboard, a keypad, a mouse, etc., and an output device, such as a printer, a display, etc. The power device 2500 may supply an operation voltage necessary for an operation of the computing system 2000.

Figure 25:
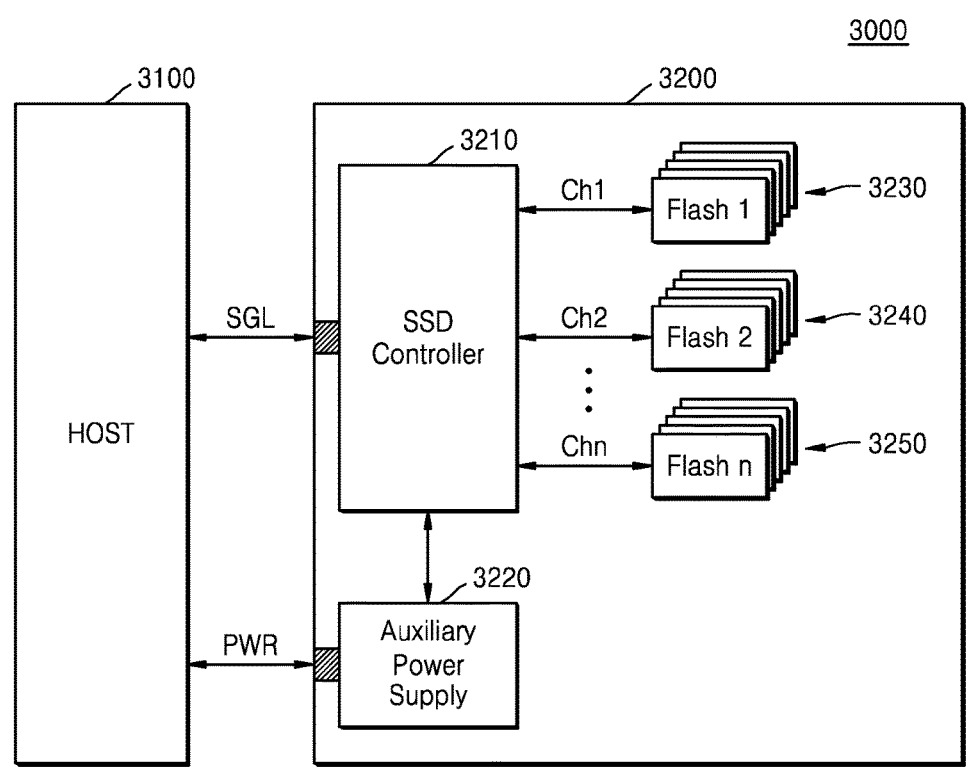
FIG. 25 is a block diagram of an example of using a memory system in a solid state drive (SSD) system, according to exemplary embodiments.

FIG. 25 is a block diagram of an example in which the memory systems 10 and 10' according to the exemplary embodiments are applied to a solid state drive (SSD) system 3000. Referring to FIG. 25, the SSD system 3000 may include a host 3100 and an SSD 3200. The SSD 3200 may exchange signals with the host 3100 via a signal connector SGL and receive power via a power connector PWR. The SSD 3200 may include an SSD controller 3210, an auxiliary power device 3220, and a plurality of memory devices 3230, 3240, and 3250. The plurality of memory devices 3230, 3240, and 3250 may be vertically stacked NAND flash memory devices. Here, the SSD 3200 may be realized by using any one of the exemplary embodiments illustrated in the accompanying drawings of this specification.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been particularly shown and described with reference to exemplary embodiments thereof, it will be understood that various changes in form and details may be made therein without departing from the spirit and scope of the following claims.

What is claimed is:

1. An operating method of a non-volatile memory device comprising a string having a plurality of memory cells and a plurality of auxiliary cells, the plurality of memory cells and the plurality of auxiliary cells being connected in series, the operating method comprising:
   detecting a threshold voltage of an auxiliary cell among the auxiliary cells; and
   generating an output signal corresponding to a deterioration level of the plurality of memory cells, based on the threshold voltage.

2. The operating method of claim 1, wherein:
   the plurality of auxiliary cells comprises a string selection transistor arranged at an end of the string and connected to a bit line, and
   the output signal indicates a deterioration of the plurality of memory cells when the threshold voltage of the string selection transistor is less than a predetermined reference value.

3. The operating method of claim 1, wherein:
   the plurality of auxiliary cells comprises a ground selection transistor, arranged at an end of the string and connected to a source line, and a dummy cell between the ground selection transistor and the plurality of memory cells, and
   the output signal indicates a deterioration of the plurality of memory cells when the threshold voltage of the dummy cell is greater than a predetermined reference value.

4. The operating method of claim 1, wherein:
   the non-volatile memory device further comprises a memory block comprising a plurality of strings, and
   the generating of the output signal comprises:
      counting the number of strings comprising an auxiliary cell having a threshold voltage greater than a predetermined reference value, from among the plurality of strings, or counting the number of the strings having the threshold voltage less than the reference value, and
      generating the counted number of strings as the output signal.

5. The operating method of claim 1, further comprising:
   receiving a command or a control signal from outside of the non-volatile memory device; and
   outputting the output signal to the outside of the non-volatile memory device, wherein
   the detecting of the threshold voltage and the generating of the output signal are performed in response to the command or the control signal.

6. The operating method of claim 1, further comprising:
   counting the number of times erasing is performed on the plurality of memory cells; and
   storing data corresponding to the output signal in a count storage unit within the non-volatile memory device, wherein
   the detecting of the threshold voltage and the generating of the output signal are performed when the number of times erasing is performed on the plurality of memory cells is one of a plurality of predetermined reference counts.

7. The operating method of claim 6, further comprising:
   receiving a command or a control signal from outside of the non-volatile memory device; and
   outputting a signal corresponding to the data stored in the count storage unit to the outside of the non-volatile memory device, in response to the command or the control signal.

8. The operating method of claim 6, wherein the plurality of predetermined reference counts are multiples of n, wherein n is an integer greater than 1.

9. The operating method of claim 1, wherein the detecting of the threshold voltage comprises:
   precharging a bit line connected to the string;
   applying a pass voltage to each of word lines connected to the plurality of memory cells;
   applying a read voltage which is less than the pass voltage to a gate line connected to the auxiliary cell; and
   sensing a voltage of the bit line.

10. The operating method of claim 9, further comprising:
    receiving a command or a control signal from outside of the non-volatile memory device; and
    changing the read voltage which is to be applied to the gate line, in response to the command or the control signal.

11. An operating method of a memory system comprising a non-volatile memory device and a memory controller configured to control the non-volatile memory device, the non-volatile memory device comprising a string having a plurality of memory cells and a plurality of auxiliary cells, the plurality of memory cells and the plurality of auxiliary cells being connected in series, the operating method comprising:
    generating, via the non-volatile memory device, an output signal corresponding to a deterioration level of the plurality of memory cells, based on a threshold voltage of an auxiliary cell among the auxiliary cells;
    transmitting, via the non-volatile memory device, the output signal to the memory controller;
    determining, via the memory controller, the deterioration level of the plurality of memory cells based on the output signal; and
    controlling, via the memory controller, the non-volatile memory device based on the determined deterioration level.

12. The operating method of claim 11, wherein:
    the plurality of auxiliary cells comprises a string selection transistor at an end of the string and connected to a bit line, and
    the output signal indicates a deterioration of the plurality of memory cells when the threshold voltage of the string selection transistor is less than a predetermined reference value.

13. The operating method of claim 11, wherein:
    the plurality of auxiliary cells comprises a ground selection transistor, arranged at an end of the string and connected to a source line, and a dummy cell between the ground selection transistor and the plurality of memory cells, and
    the output signal indicates a deterioration of the plurality of memory cells when the threshold voltage of the dummy cell is higher than a predetermined reference value.

14. The operating method of claim 11, further comprising:
    transmitting, via the memory controller, a command or a control signal to the non-volatile memory device, wherein
the generating of the output signal and the transmitting of the output signal are performed in response to the command or the control signal.

15. The operating method of claim 14, wherein:
the non-volatile memory device comprises a memory block comprising a plurality of strings, and
the operating method further comprises:
counting, via the memory controller, the number of times erasing is performed on the memory block, and
the transmitting of the command or the control signal and the determining of the deterioration level are performed when the number of times erasing is performed on the memory block is one of a plurality of predetermined reference counts.

16. The operating method of claim 15, wherein the generating of the output signal via the non-volatile memory device comprises:
counting the number of strings, each comprising an auxiliary cell, having a threshold voltage greater than a predetermined reference value, from among the plurality of strings, or counting the number of the strings having the threshold voltage which is less than the reference value, and
generating the counted number of strings as the output signal.

17. The operating method of claim 16, wherein:
the memory system comprises a look-up table configured to store numbers of strings which respectively correspond to the plurality of predetermined reference counts and a deterioration level storage unit configured to store deterioration information of the memory block, and
the determining of the deterioration level via the memory controller comprises:
reading, from the look-up table, a number of first strings corresponding to the number of times erasing is performed on the memory block, and
comparing the number of first strings with a number of second strings corresponding to the output signal, and when the number of second strings is greater than the number of first strings, updating data stored in the deterioration level storage unit.

18. The operating method of claim 17, wherein the controlling of the non-volatile memory device via the memory controller comprises selecting a memory block, among a plurality of memory blocks, to be erased via the non-volatile memory device, based on the data stored in the deterioration level storage unit.

19. The operating method of claim 17, wherein the controlling of the non-volatile memory device via the memory controller comprises selecting a memory block, among a plurality of memory blocks, to which data is to be written via the non-volatile memory device, based on the data stored in the deterioration level storage unit.

20. The operating method of claim 15, wherein the plurality of predetermined reference counts are multiples of n, wherein n is an integer greater than 1.

* * * * *